US012628576B2

(12) United States Patent
Lee

(10) Patent No.: US 12,628,576 B2
(45) Date of Patent: May 12, 2026

(54) FABRICATION OF N-FACE III-NITRIDES BY REMOTE EPITAXY

(71) Applicant: Kyusang Lee, Charlottesville, VA (US)

(72) Inventor: Kyusang Lee, Charlottesville, VA (US)

(73) Assignee: Future Semiconductor Business, Inc, Charlottesville, VA (US)

( * ) Notice: Subject to any disclaimer, the term of this patent is extended or adjusted under 35 U.S.C. 154(b) by 93 days.

(21) Appl. No.: 18/084,582

(22) Filed: Dec. 20, 2022

(65) Prior Publication Data

US 2024/0420955 A1 Dec. 19, 2024

(51) Int. Cl.
| | |
|---|---|
| *H01L 21/02* | (2006.01) |
| *C30B 25/18* | (2006.01) |
| *C30B 29/40* | (2006.01) |
| *H10D 30/01* | (2025.01) |

(52) U.S. Cl.
CPC ........ *H01L 21/0254* (2013.01); *C30B 25/183* (2013.01); *C30B 29/403* (2013.01); *C30B 29/406* (2013.01); *H01L 21/02444* (2013.01); *H01L 21/02458* (2013.01); *H10D 30/015* (2025.01)

(58) Field of Classification Search
CPC ........... H01L 21/0254; H01L 21/02458; C30B 25/183; C30B 29/403; C30B 29/406; H10D 30/015; H10D 62/405; H10D 62/8503; H10D 30/473
See application file for complete search history.

(56) References Cited

U.S. PATENT DOCUMENTS 10,770,289 B2 9/2020 Kim
2013/0026489 A1* 1/2013 Gambin ............. H10D 30/4732
257/77

OTHER PUBLICATIONS

Kim et al., "Principle of direct van der Waals epitaxy of single-crystalline films on epitaxial graphene", Nature Communications | 5:4836, 2014 (Year: 2014).*
Kim et al., "Remote epitaxy through graphene enables two-dimensional material-based layer transfer."340 | Nature | vol. 544 | Apr. 20, 2017 (Year: 2017).*

* cited by examiner

*Primary Examiner* — Julia Slutsker
(74) *Attorney, Agent, or Firm* — James D. McFarland

(57) ABSTRACT

III-Nitrides epilayer(s) are grown "remotely" on a 2D material layer, such as graphene or h-BN, aBN, or polycrystalline BN coated crystalline substrate, where the Nitride-face surface of the epilayer faces the 2D material. A small mechanical force using a 2D material-based layer transfer process is used to separate the III-Nitrides epilayer(s) at their interface with the 2D material layer. Alternatively, the III-Nitrides epilayer is removed by mechanical force from a substrate with the assistance of a first thermal release tape and an optional metal layer on the epilayer and then a second thermal release tape and/or optional metal layer, is applied to the Nitride-face of the epilayer, the first thermal release tape and first metal layer are removed, the Ga-face surface is bonded to a substrate, and the second thermal release tape is removed. The resulting Nitride-face surface of the epilayer has high quality. A HEMT may be formed using the above structures.

5 Claims, 22 Drawing Sheets

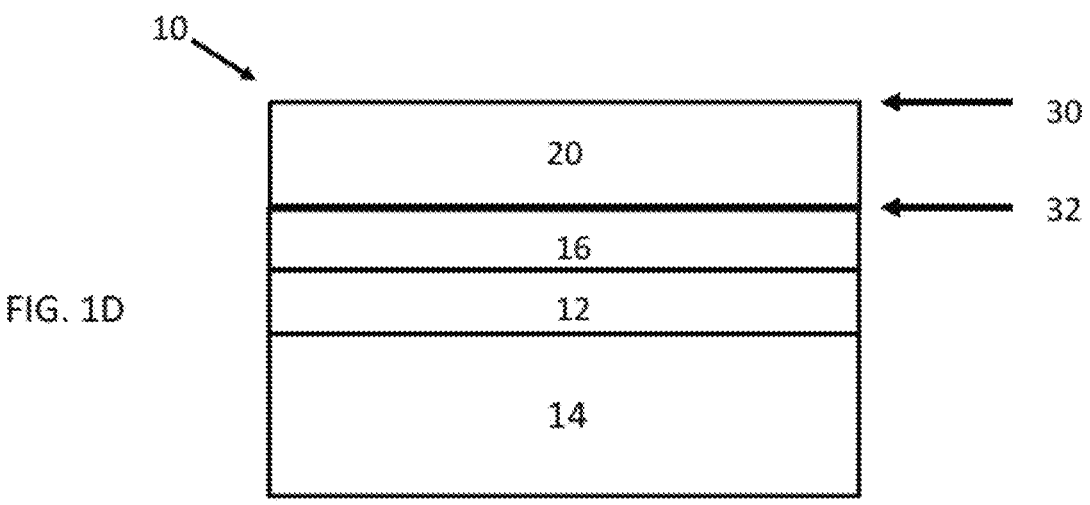
FIG. 1D
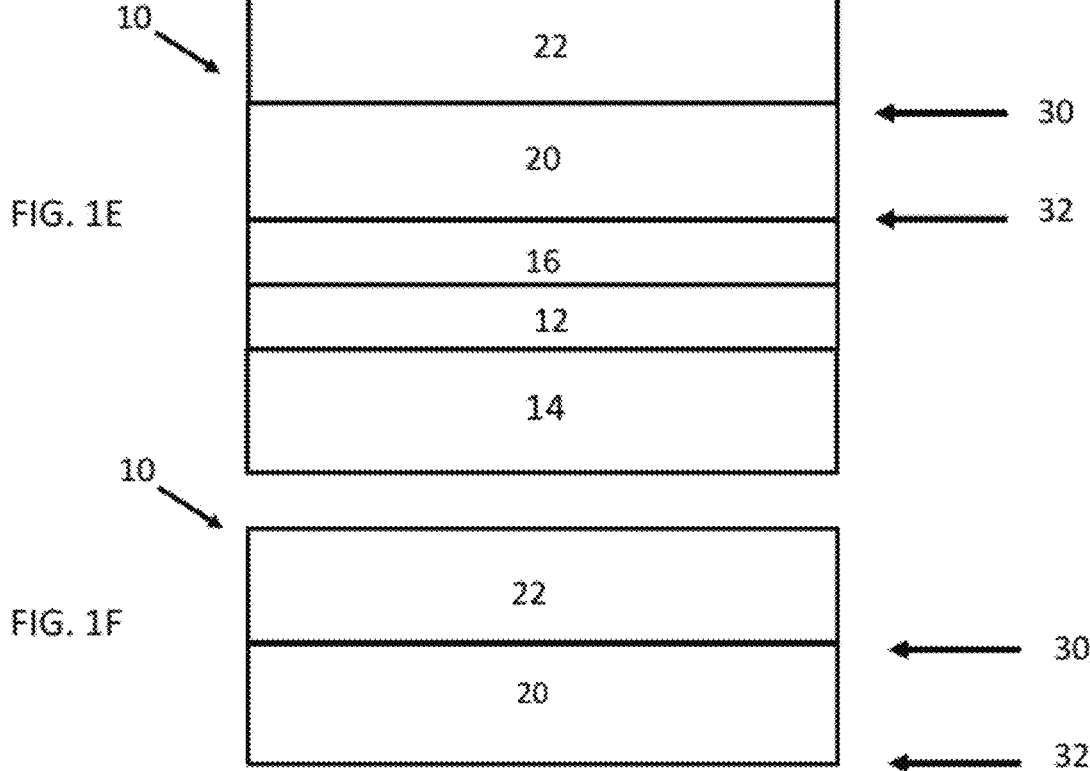
FIG. 1E
FIG. 1F

Flip

N face 32

30

Metal face 30

40
50

60

Supporting layer

20

40
50

60

*Supporting layer
1) Ti/Ni metal stressor double layer
2) PMMA layer : uncured coating
   via spin coater

65

Supporting layer

20

40
50

65

Supporting layer

20

Ti/Ni metal stressor
double layer removal

N face 32

20

Metal face 30

40
50
60

Flip

Glass substrate

Polyimide (PI) or Spin on Glass (SOG) layer

Coating by spin coater and curing process

20

40
50
60

Glass substrate

Polyimide (PI) or Spin on Glass (SOG) layer

20

40
50

Glass substrate

Polyimide (PI) or Spin on Glass (SOG) layer

20

Ti/Ni metal stressor double layer removal

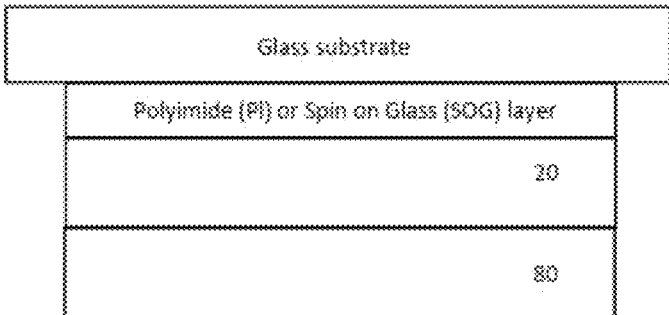
Fig. 3E
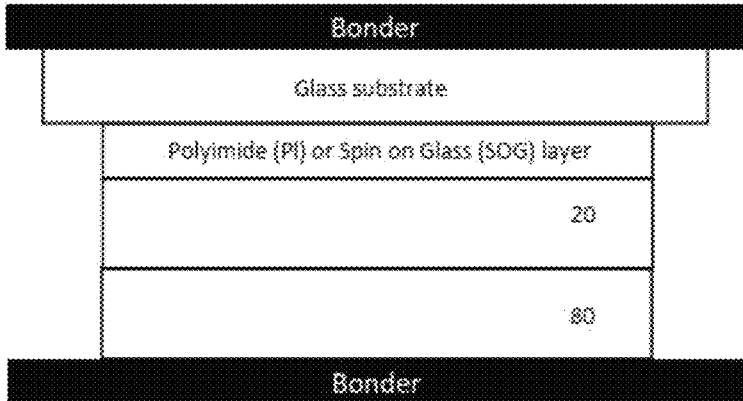
Fig. 3F
Removal of glass substrate by removal of PI layer or SOG layer via oxygen plasma reactive ion etching (RIE) (dry etching)
Fig. 3G

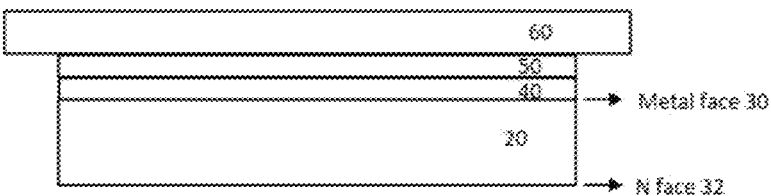
Fig. 4A
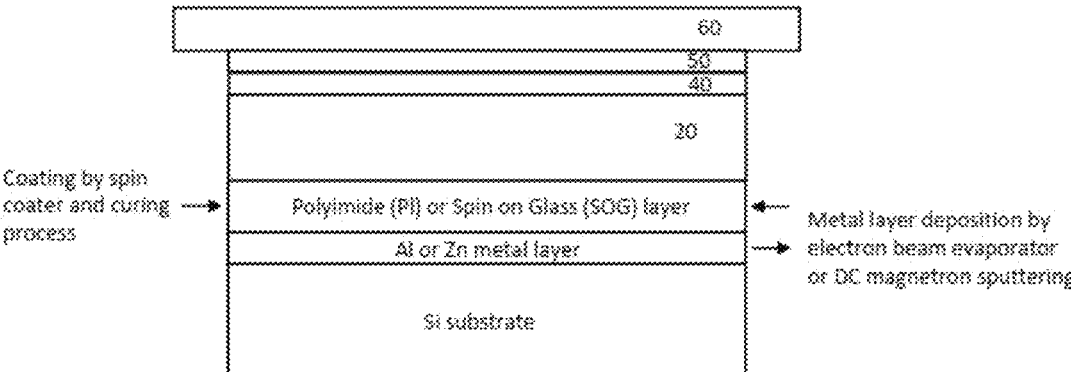
Fig. 4B
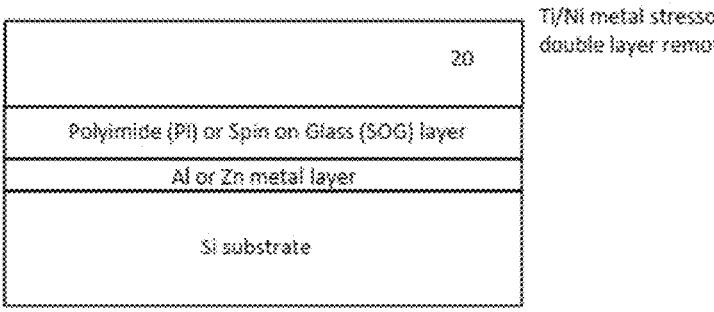
Fig. 4C
Fig. 4D

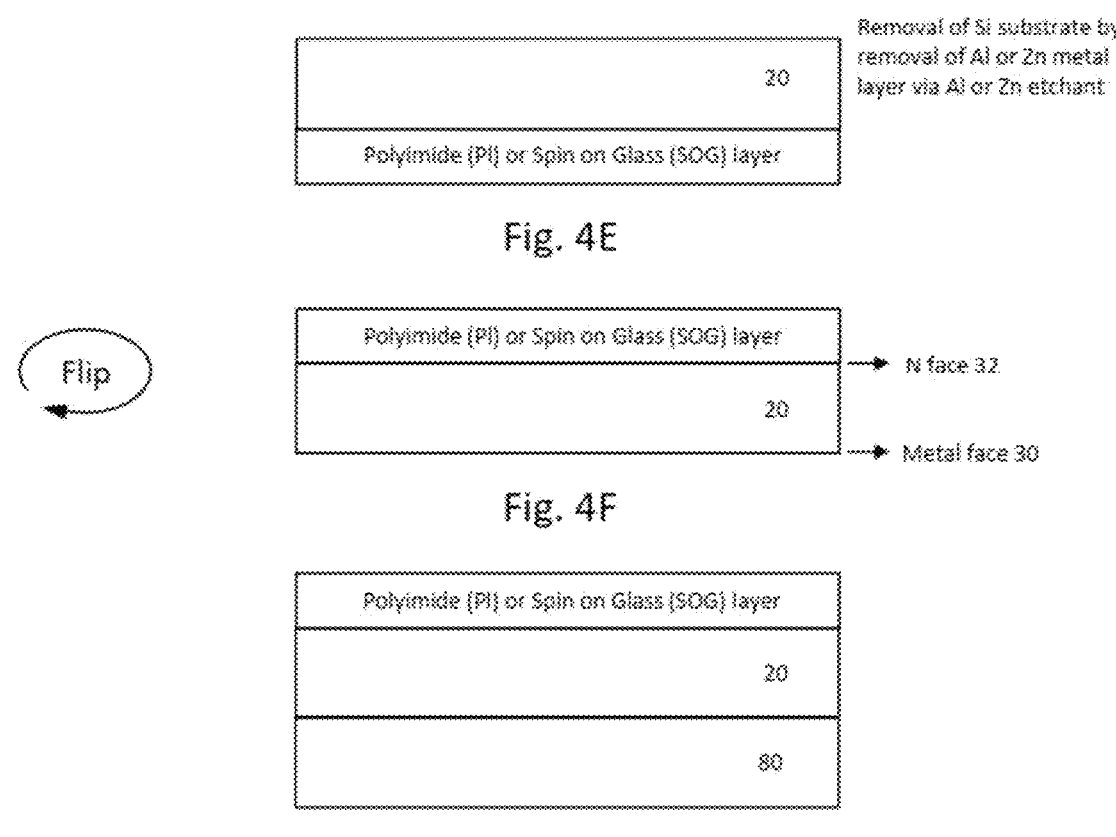
Removal of Si substrate by removal of Al or Zn metal layer via Al or Zn etchant
Fig. 4E
N face 32
Metal face 30
Flip
Fig. 4F
Fig. 4G
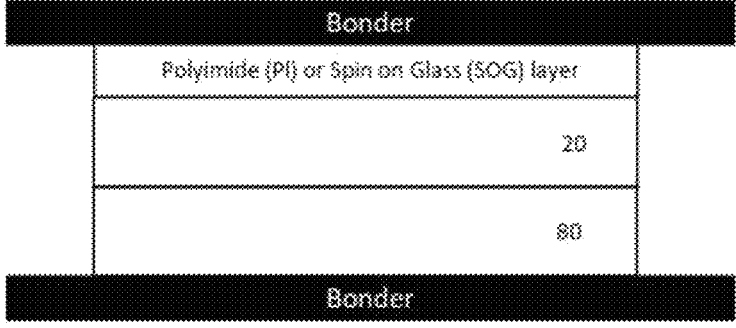
Fig. 4H
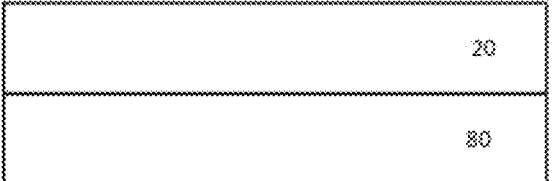
Removal of PI layer or SOG layer via oxygen plasma reactive ion etching (RIE) (dry etching)
Fig. 4I

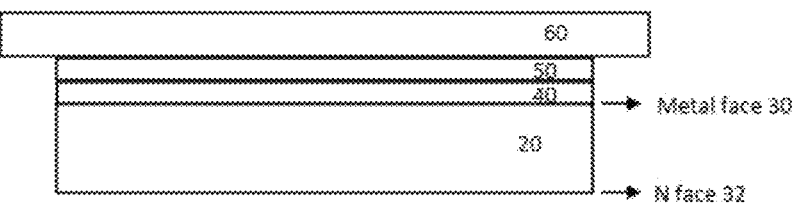
Fig. 5A
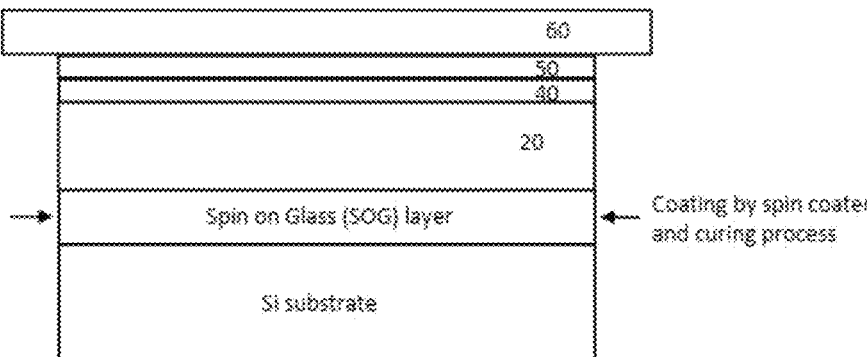
Fig. 5B
Fig. 5C
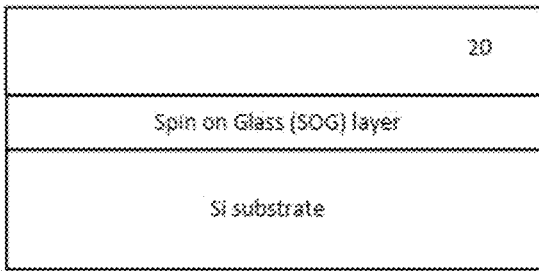
Fig. 5D

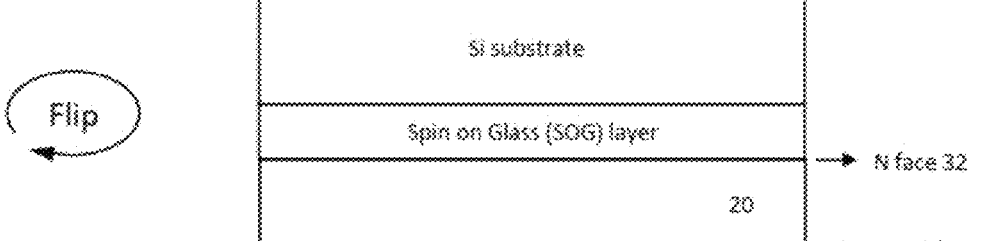
Fig. 5E
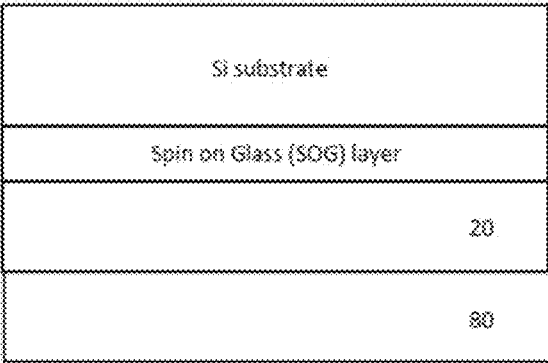
Fig. 5F
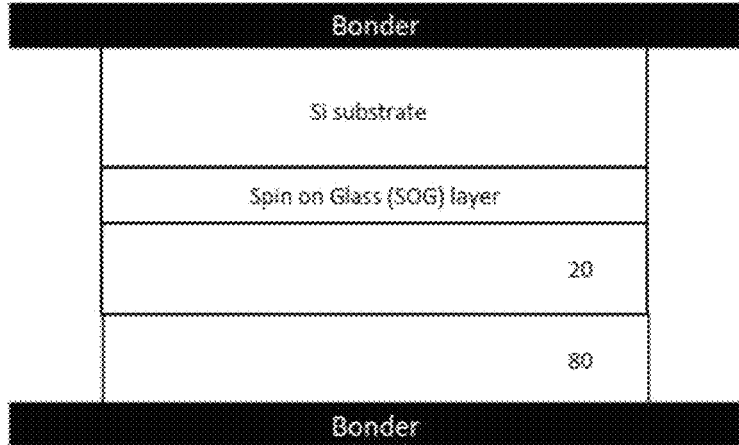
Fig. 5G
Removal of Si substrate by removal of SOG layer via oxygen plasma reactive ion etching (RIE) (dry etching)
Fig. 5H 900
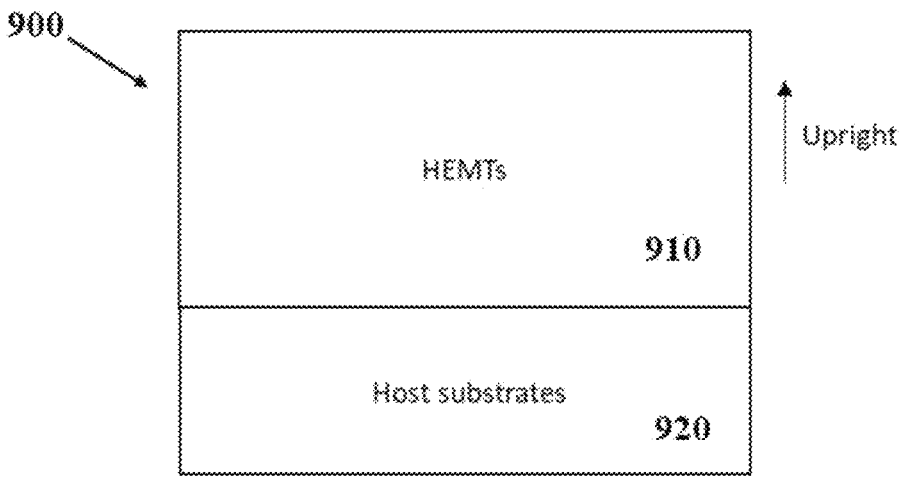
Fig. 9A
900
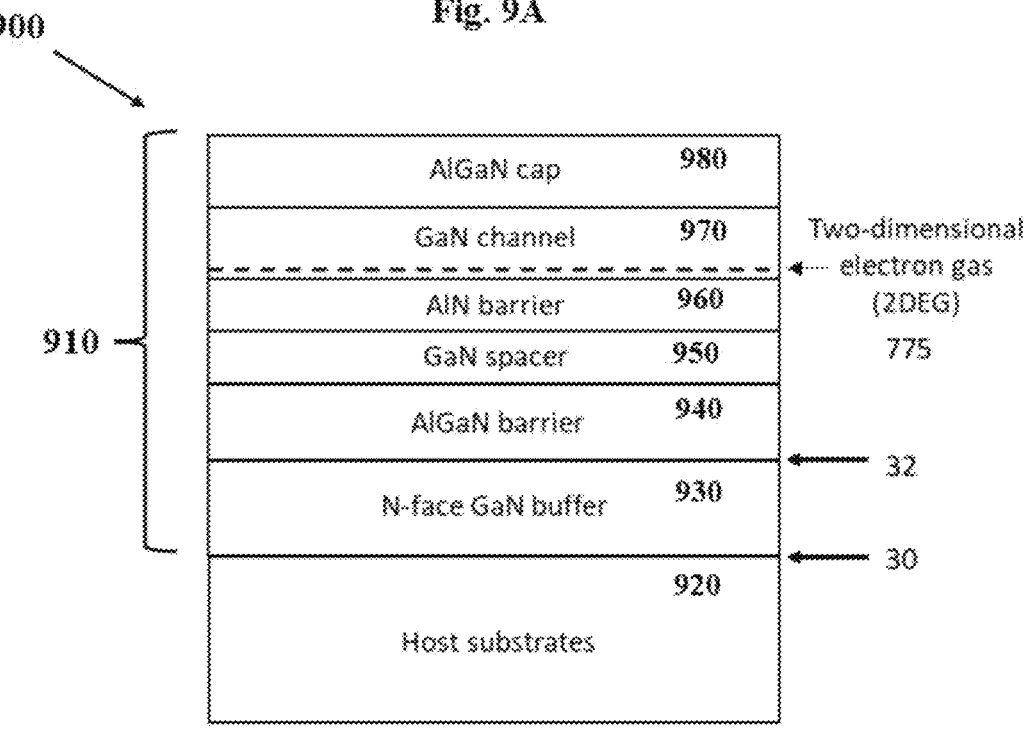
Fig. 9B (Example)

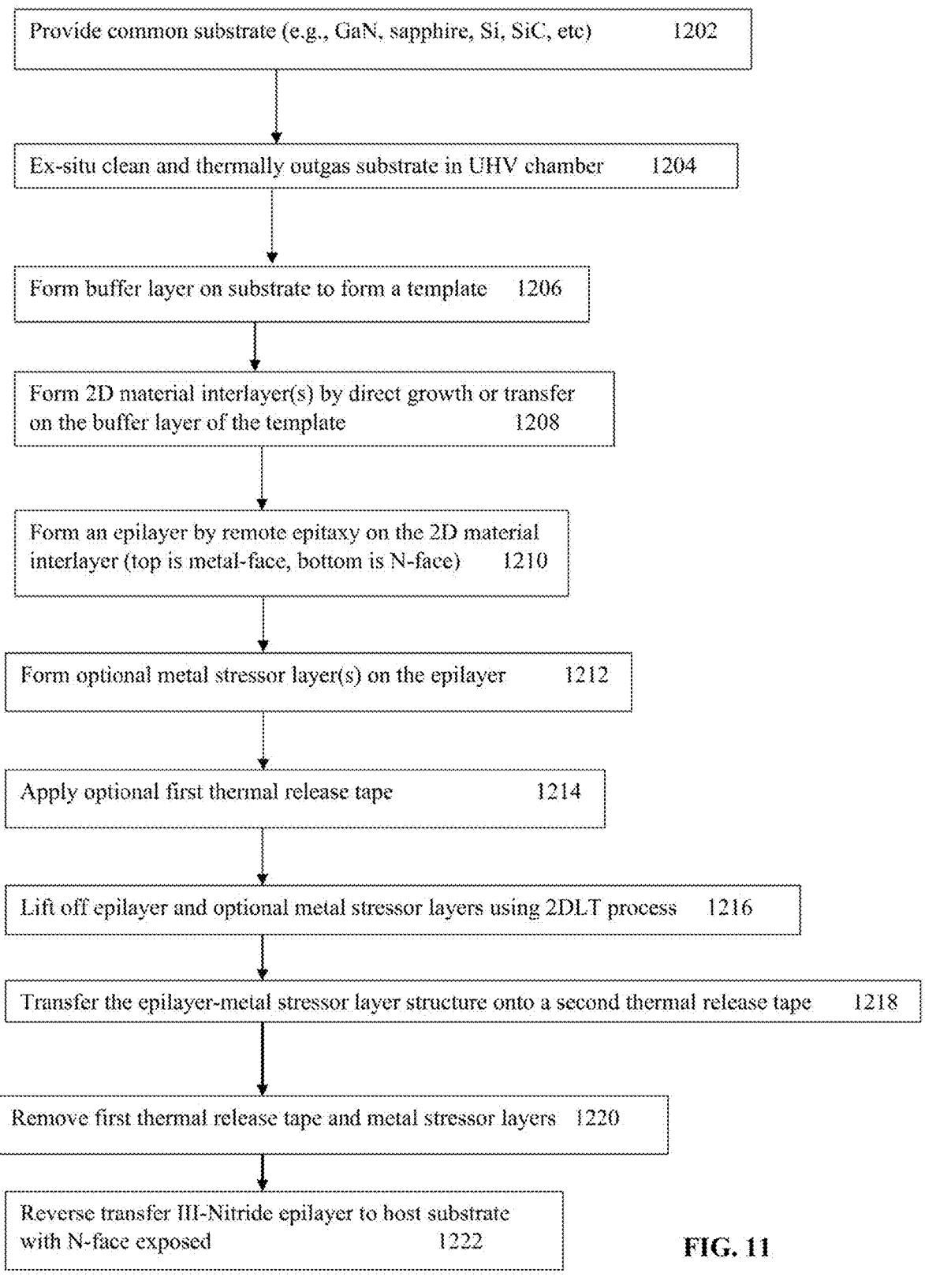

Provide common substrate (e.g., GaN, sapphire, Si, SiC, etc)     1202

Ex-situ clean and thermally outgas substrate in UHV chamber     1204

Form buffer layer on substrate to form a template     1206

Form 2D material interlayer(s) by direct growth or transfer on the buffer layer of the template     1208

Form an epilayer by remote epitaxy on the 2D material interlayer (top is metal-face, bottom is N-face)     1210

Form optional metal stressor layer(s) on the epilayer     1212

Apply optional first thermal release tape     1214

Lift off epilayer and optional metal stressor layers using 2DLT process     1216

Transfer the epilayer-metal stressor layer structure onto a second thermal release tape     1218

Remove first thermal release tape and metal stressor layers     1220

Reverse transfer III-Nitride epilayer to host substrate with N-face exposed     1222

FIG. 11

FABRICATION OF N-FACE III-NITRIDES BY REMOTE EPITAXY

RELATED APPLICATIONS

Concurrently filed U.S. patent application titled "Monolithic Remote Epitaxy of Compound Semiconductors and 2D Materials" and having Ser. No. 17/880,692 is incorporated herein by reference in its entirety.

FIELD

The field of the present disclosure is directed to the fabrication of N-face III-Nitrides.

BACKGROUND

III-nitride semiconductors have become a cornerstone of modern electronic and optoelectronic devices. The nitrides of group III metal elements include aluminum nitride (AlN), gallium nitride (GaN), indium nitride (InN), boron nitride (BN) and their alloys, all of which are compounds of nitrogen. III-nitride semiconductors crystallize in their most stable form into a wurtzite crystallographic structure with nitrogen atoms forming a hexagonal close packed (hcp) structure and the group III atoms occupying half of the tetrahedral sites available in the hcp lattice. III-nitrides are polar crystals as they do not have a center of symmetry.

III-Nitride semiconductors, when grown on a substrate, can have two different orientations: metal-face and nitride-face (N-face). Metal-face III-Nitrides include, for example, gallium-face (Ga-face), aluminum-face (Al-face), Indium-face (In-face), and Boron-face (B-face) III-Nitrides. The orientation of the final epilayer is a function of the original substrate orientation, buffer growth, and doping conditions. In Ga-face devices, for example, the electron channel forms at the bottom of the AlGaN/GaN (aluminum-gallium nitride/gallium nitride) heterointerface, while in N-face devices, the channel is induced at the top of the GaN/AlGaN interface.

N-face III-Nitrides materials may effectively solve problems in various device applications through a polarization inversion. N-face orientation (000$\bar{1}$) GaN-based high electron mobility transistors (HEMTs) facilitate very low specific resistance ohmic contacts and form a natural confining electron back barrier over structures grown on the conventional Ga-face. Moreover, for photovoltaic applications, the internal polarization of N-face GaN material would trigger beneficial impacts on the collection of photogenerated carriers.

In the MOCVD process, reactant gases are introduced into the system at high pressure, such as about 1 torr. By contrast, the MBE process requires Ultra High Vacuum conditions (i.e., pressures below $10^{-8}$ Torr) for deposition.

N-face GaN has been obtained generally by nitriding c-plane sapphire ($Al_2O_3$) substrate and then applying heavy doping of Magnesium (Mg), and Germanium Ge (111) substrate through the Molecular Beam Epitaxy process. Germanium (111) refers to the (111) crystallographic orientation of the epitaxial Germanium. Also, N-face GaN can be grown on a carbide-face (C-face) (000-1) 6H-SiC substrate with n-type doping of silane ($SiH_4$) by using a low-pressure metal organic chemical vapor deposition (LP-MOCVD) process. 6H-SiC is a silicon carbide composed of two-thirds cubic bonds and one-third hexagonal bonds with a stacking sequences of ABCACB.

Remote epitaxy is a technology that grows III-Nitrides epilayers "remotely" on two-dimensional (2D) materials, such as crystalline substrates coated with graphene or monolayer boron nitride (BN), which is also referred to as "white graphene," without generating significant defects and cracks as long as the potential field from the substrate is strong enough to penetrate through the 2D material interlayers. See, e.g. W. Kong, H. Li, K. Qiao, Y. Kim, K. Lee, Y. Nie, D. Lee, T. Osadchy. R. J. Molnar, D. K. Gaskill, R. L. Myers-Ward, K. M. Daniels, Y. Zhang, S. Sundram, Y. Yu, S.-H. Bae, S. Rajan, Y. Shao-Horn, K. Cho, A. Ougazzaden, J. C. Grossman, and J. Kim, "Polarity governs atomic interaction through two-dimensional materials," *Nature Materials*, vol. 17, pp. 999-1004, 2018.

The interface between III-Nitrides epilayers and 2D materials can be separated by applying a minimal or small mechanical force by using a 2D material based layer transfer (2DLT) process because 2D materials have a weak vertical van der Waals interaction that can be easily overcome. See, e.g., Y. Kim, S. S. Cruz, K. Lee, B. O. Alawode, C. Choi, Y. Song, J. M. Johnson, C. Heidelberger, W. Kong, S. Choi, K. Qiao, I. Almansouri, E. A. Fitzgerald, J. Kong, A. M. Kolpak, J. Hwang, and J. Kim, "Remote epitaxy through graphene enables two-dimensional material-based layer transfer," *Nature*, vol. 544, pp. 340-343, 2017, the entirety of which is incorporated herein by reference.

However. N-face GaN epilayers have received less attention due to difficulties in achieving high-quality growth and smooth surface roughness compared to Ga-face GaN. Thus, there is a need for an improved method of fabricating N-face III-Nitrides with high quality growths and smooth surfaces.

SUMMARY

The following presents a simplified summary in order to provide a basic understanding of one or more aspects of the improved method. This summary is not an extensive overview of the invention, is not intended to identify key or critical elements of the invention, is not intended to limit the order of process steps, and is not intended to delineate the scope of the invention. Rather, the primary purpose of the summary is to present some concepts of the invention in a simplified form as a prelude to a more detailed description that is presented later.

A novel method of fabricating a N-face III-Nitride layer (including, but not limited to, GaN, AlN, InN, and hexagonal BN (h-BN), and their alloys) employs remote epitaxy to grow the III-Nitride epitaxy layer(s) on a substrate, uses a 2D material based layer transfer (2DLT) to lift off and remove the III-Nitride epitaxy layer(s), and transfers the III-Nitride epitaxy layer(s) to a substrate to form a N-face III-Nitride structure having a high-quality smoother surface on the N-face III-Nitride. The novel process improves the surface and crystalline quality of N-face III-Nitrides (including, but not limited to, GaN, AlN, InN, h-BN, $Al_xGa_{1-x}N$, $In_xGa_{1-x}N$, $B_xGa_{1-x}N$, $Al_xIn_yGa_{1-x-y}N$, $In_xAl_{1-x}N$, $Ga_xAl_{1-x}N$, $B_xAl_{1-x}N$, $In_xGa_yAl_{1-x-y}N$, $Al_xIn_{1-x}N$, $Ga_xIn_{1-x}N$, $Al_x Ga_yIn_{1-x-y}N$, $h-Ga_xB_{1-x}N$, and their alloys) epilayers by combining remote epitaxy and 2DLT techniques.

BRIEF DESCRIPTION OF THE FIGURES

FIG. 1D is a cross-sectional view of a film structure having a GaN, AlN, InN, or h-BN epilayer (top: metal-face and bottom: N-face) on the 2D material interlayers of the structure of FIG. 1B or 1C.

FIG. 1E is a cross-sectional view of the film structure of FIG. 1D after directly bonding the metal-face of the GaN, AlN, InN, or h-BN epilayer to a host substrate.

FIG. 1F is a cross-sectional view of the film structure of FIG. 1E after the GaN, AlN, InN, or h-BN epilayer and the second host substrate are lifted off, where the N-face of the epilayer is exposed.

FIG. 3E is a cross-sectional view of the film structure of FIG. 3D after it has been transferred onto host substrate.

FIG. 3F is a cross-sectional view of the film structure of FIG. 3E after III-Nitrides epilayers and host substrate are directly bonded by wafer bonder.

FIG. 3G a cross-sectional view of the film structure of FIG. 3F after glass substrate is removed by removal of PI layer or SOG layer.

FIG. 4A is a cross-sectional view of the separated III-Nitrides epilayer(s) (top: metal-face and bottom: N-face), Ti or Cr metal stressor layer, Ni metal stressor layer, and first thermal release tape.

FIG. 4B is a cross-sectional view of the film structure of FIG. 4A after it has been attached onto Polyimide (PI) or Spin on Glass (SOG) layer coated on Al or Zn metal layer deposited on Si substrate.

FIG. 4C is a cross-sectional view of the film structure of FIG. 4B after first thermal release tape is removed.

FIG. 4D is a cross-sectional view of the film structure of FIG. 4C after Ti or Cr metal stressor layer and Ni metal stressor layer are removed.

FIG. 4E is a cross-sectional view of the film structure of FIG. 4D after Si substrate is removed by removal of Al or Zn metal layer.

FIG. 4F is a cross-sectional view of the film structure of FIG. 4E after it has been flipped over. (III-Nitrides epilayers (top: N-face and bottom: metal-face)).

FIG. 4G is a cross-sectional view of the film structure of FIG. 4F after it has been transferred onto host substrate.

FIG. 4H is a cross-sectional view of the film structure of FIG. 4G after III-Nitrides epilayers (top: N-face and bottom: metal-face) and host substrate are directly bonded by wafer bonder.

FIG. 4I is a cross-sectional view of the film structure of FIG. 4H after PI layer or SOG layer is removed.

FIG. 5A is a cross-sectional view of the separated III-Nitrides epilayer(s) (top: metal-face and bottom: N-face), Ti or Cr metal stressor layer, Ni metal stressor layer, and first thermal release tape.

FIG. 5B is a cross-sectional view of the film structure of FIG. 5A after it has been attached onto Spin on Glass (SOG) layer coated Si substrate.

FIG. 5C is a cross-sectional view of the film structure of FIG. 5B after first thermal release tape is removed.

FIG. 5D is a cross-sectional view of the film structure of FIG. 5C after Ti or Cr metal stressor layer and Ni metal stressor layer are removed.

FIG. 5E is a cross-sectional view of the film structure of FIG. 5D after it has been flipped over. (III-Nitrides epilayers (top: N-face and bottom: metal-face)).

FIG. 5F is a cross-sectional view of the film structure of FIG. 5E after it has been transferred onto host substrate.

FIG. 5G is a cross-sectional view of the film structure of FIG. 5F after III-Nitrides epilayers (top: N-face and bottom: metal-face) and host substrate are directly bonded by wafer bonder.

FIG. 5H a cross-sectional view of the film structure of FIG. 5G after Si substrate is removed by removal of SOG layer.

FIG. 9A is a cross-sectional view of a HEMT film device.

FIG. 9B is a cross-sectional view of an example of the HEMT film device of FIG. 9A that is formed on the structure of FIG. 2G, where a detailed example of the HEMT is illustrated.

FIG. 11 is a block flow diagram demonstrating methods for fabricating an N-face surface in a GaN epilayer according to an embodiment of the novel process.

DETAILED DESCRIPTION OF THE EMBODIMENTS

Figures 1A, 1B, 1C:
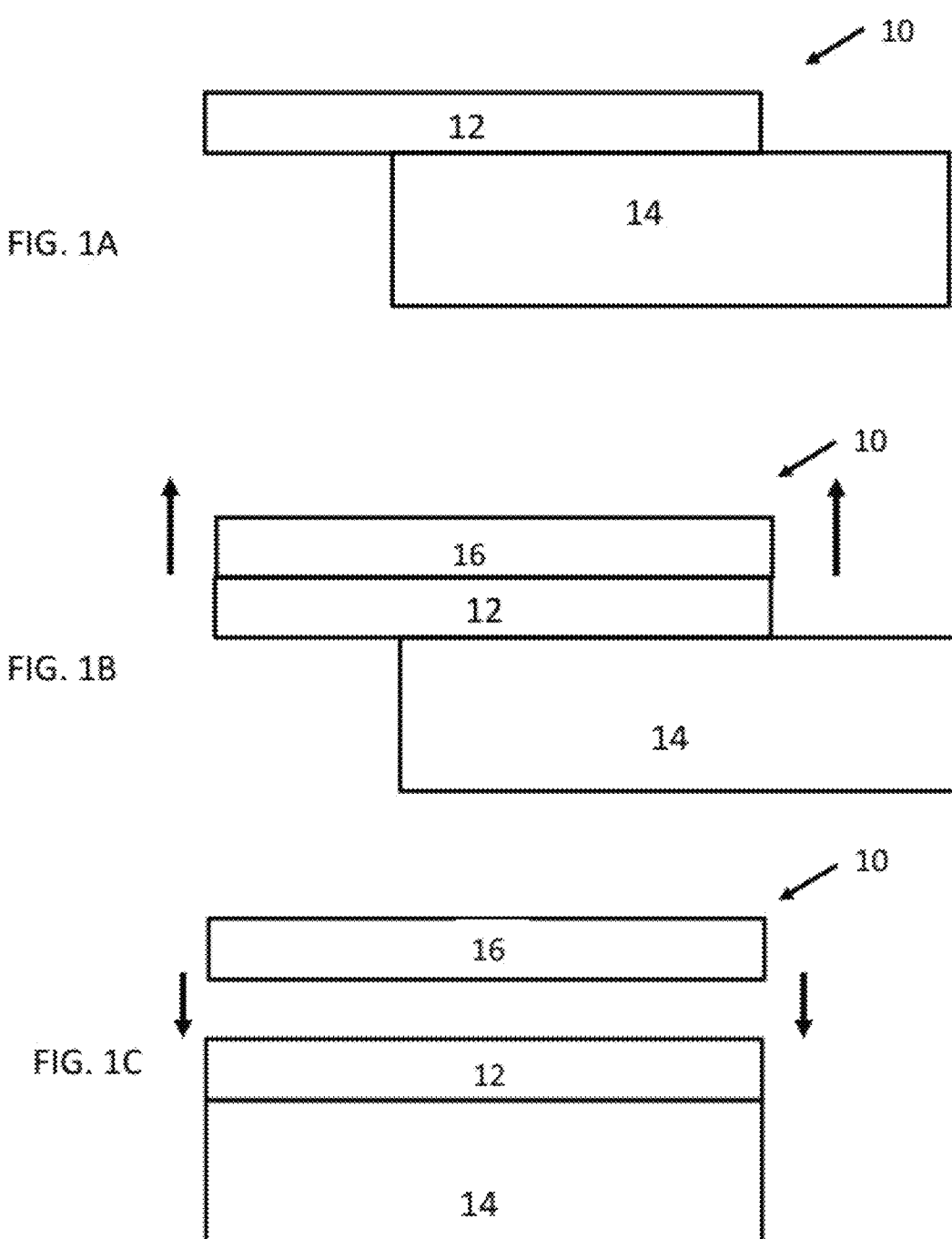
FIG. 1A is a cross-sectional view of a film structure having an optional GaN, AlN, InN, or h-BN buffer layer disposed on a substrate.
FIG. 1B is a cross-sectional view of a film structure having 2D material interlayers formed by direct growth on the buffer layers on a substrate (e.g., GaN, AlN, InN, h-BN templates).
FIG. 1C is a cross-sectional view of a film structure having 2D material interlayers transferred onto the buffer layers on a substrate (e.g., GaN, AlN, InN, h-BN templates).

One or more aspects of the present invention are described with reference to the following description and the accompanying drawings, wherein like reference numerals are generally utilized to refer to like elements throughout, and wherein the various structures are not necessarily drawn to scale. These are indicative, however, of but a few of the various ways in which the principles of the invention may be employed. Other objects, advantages and novel features of the invention will become apparent from the following detailed description of the invention when considered in conjunction with the drawings. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are shown in block diagram or not shown in detail to avoid obscuring the invention. The present invention is not limited by the illustrated ordering of acts or events, as some acts may occur in different orders and/or concurrently with other acts or events. Further, not all illustrated acts or events are required to implement a methodology in accordance with the present invention.

In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. While a particular feature of the invention may have been disclosed with respect to only one of several aspects of the implementations, such feature may be combined with one or more other features of other implementations as may be desired and advantageous for any given or particular application.

The present disclosure introduces novel methods for fabricating a high-quality surface structure on N-face III-Nitrides (including, but not limited to, GaN, AlN, InN, hexagonal BN (h-BN), $Al_xGa_{1-x}N$, $In_xGa_{1-x}N$, $B_xGa_{1-x}N$, $Al_xIn_yGa_{1-x-y}N$, $In_xAl_{1-x}N$, $Ga_xAl_{1-x}N$, $B_xAl_{1-x}N$, $In_xGa_yAl_{1-x-y}N$, $Al_xIn_{1-x}N$, $Ga_xIn_{1-x}N$, $Al_xGa_yIn_{1-x-y}N$, $h\text{-}Ga_xB_{1-x}N$, and their alloys) that improves the surface and crystalline quality of the N-face III-Nitrides by employing remote epitaxy and 2D material based layer transfer (2DLT) techniques.

N-face III-Nitrides including GaN-based devices have advantages over structures grown on a metal-face, including Gallium-face, Aluminum-face, Indium-face and Boron-face. Such advantages may include a lower specific contact resistance and better confinement of electrons. The different position of the electron channel in N-face III-Nitride devices compared to Ga-face devices provides N-face transistors with a natural back-barrier to the injection of electrons into the buffer. In these devices, and for aluminum gallium nitride (AlGaN) buffer transistors, the wide bandgap of the AlGaN layer prevents the injection of electrons into the GaN buffer, which significantly reduces the short-channel effects. In addition, the very thin AlGaN layers that typically are thinner than 30 nm assure an efficient heat dissipation that overcomes one of the main challenges in nitride HEMTs having AlGaN buffers.

However, even though N-face III-Nitrides epilayers could be grown by using conventional MBE, Hydride Vapor Phase Epitaxy (HVPE), or MOCVD growth techniques, there are still technical difficulties for the epitaxial growth of N-face III-Nitrides. As a result, the surface structures of N-face III-Nitrides are still relatively rough, and the crystalline quality of N-face III-Nitrides is not as good as metal-face III-Nitrides. Therefore, it is critical to improve these failure issues in structural behavior because they have a detrimental impact on the performance and reliability of III-Nitrides-based devices.

FIG. 1A is a cross-sectional view of a film structure 10 having an optional GaN, AlN, InN, or h-BN buffer layer(s) 12 disposed on a first host substrate 14. The substrate 14 may be a common substrate, such as GaN, sapphire, AlN, GaN on silicon, silicon carbide SiC, Silicon, Silicon dioxide SiO2, Silicon nitride SiN on sapphire, AlN on silicon, GaN on sapphire, AlN on sapphire and metal foils, such as flexible molybdenum Mo, titanium Ti, tantalum Ta, copper Cu, and hafnium Hf foils, etc.

Prior to growing the buffer layer 12, the substrate 14 may be ex-situ cleaned by boiling in acetone and ethyl alcohol for 5 minutes and dried with flowing nitrogen gas before loaded into a MOCVD system where reactant gases are introduced into the system at high pressure, such as about 1 torr. to prepare the GaN, AlN, InN, h-BN and other III-Nitride templates, one or more optional buffer layers 12 such as GaN, AlN, InN, or h-BN is grown epitaxially on the cleaned substrate 14 by use of the MOCVD tool. For example, a GaN, AlN, InN, or h-BN buffer layer 12 with a thickness ranging from 200 nm to 5 um is grown at substrate temperatures (600° C. to 900° C.) employed for MOCVD growth of a GaN, AlN, InN, or h-BN layer under nitrogen ($N_2$) plasma. The metal sources such as gallium (Ga), aluminum (Al), indium (in), and boron (B) are provided with ingot type whose purity is preferably at least 99.9999% (6N) to 99.99999% (7N). Further, prior to growing the buffer layer 12, the substrate 14 may be ex-situ cleaned by boiling in acetone and ethyl alcohol for 5 minutes and dried with flowing nitrogen gas before loaded into a MBE system and then thermally outgassed in ultrahigh vacuum (UHV) in the chamber of the MBE tool at 900° C. for 1 hour to 2 hours. As shown in FIG. 1A, to prepare the GaN, AlN, InN, h-BN and other III-Nitride templates, one or more optional buffer layers 12 such as GaN, AlN, InN, or h-BN is grown epitaxially on the cleaned substrate 14 by use of the MBE tool. For example, a GaN, AlN, InN, or h-BN buffer layer 12 with a thickness ranging from 200 nm to 5 um is grown at substrate temperatures (600° C. to 900° C.) employed for MBE growth of a GaN, AlN, InN, or h-BN layer under nitrogen (N₂) plasma. The metal sources such as gallium (Ga), aluminum (Al), indium (in), and boron (B) are provided with ingot type whose purity is preferably at least 99.9999% (6N) to 99.99999% (7N). The nitrogen source is supplied with a radio frequency (RF) nitrogen (N₂) plasma unit through a mass flow controller. In particular, the h-BN is grown through evaporating the boron source with ingot type by electron-beam gun and flowing N₂ gas by a RF plasma source. The growth temperatures are ranged from 600° C. to 1,200° C., as measured by a pyrometer.

Thus, because the substrate 14 will not preferably be the final substrate of the N-face III-Nitride device, the ill-Nitride epilayers are grown "remotely" on a 2D material layer 14, such as such as graphene, a-BN, h-BN, cubic BN (c-BN), MoSe₂, WSe₂, MoS₂, WS₂, CrO₂, CrS₂, VO₂, VS₂, and NbSe₂ coated crystalline substrates. A III-N can be fabricated on the amorphous, polycrystalline, or single crystal 2D material interlayer transferred single crystalline III-N, SiC and sapphire substrate using Molecular Beam Epitaxy (MBE), Metal Organic Chemical Vapor Deposition (MOCVD), Hydride Vapor Phase Epitaxy (HVPE), or any of the methods described in co-pending and concurrently filed U.S. patent application titled "Monolithic Remote Epitaxy of Compound Semiconductors and 2D Materials." This epitaxial growth can be achieved without generating significant defects and cracks as long as the potential field from the substrate 14 is strong enough to penetrate through the 2D material interlayers. For a detailed process for the remote growth of the III-Nitrides epilayers, see, for example, the following reference: W. Kong, H. Li, K. Qiao, Y. Kim, K. Lee, Y. Nie, D. Lee, T. Osadchy. R. J. Molnar, D. K. Gaskill, R. L. Myers-Ward, K. M. Daniels, Y. Zhang, S. Sundram, Y. Yu, S.-H. Bae, S. Rajan, Y. Shao-Horn, K. Cho, A. Ougazzaden, J. C. Grossman, and J. Kim, "Polarity governs atomic interaction through two-dimensional materials," *Nature Materials*, vol. 17, pp. 999-1004, 2018, the entirety of which is incorporated herein by reference.

The most stable growth direction of III-Nitrides crystals 12 is in the c-direction perpendicularly away from the top planar surface of the substrate 14, with (0001) metal-face on top and (000-1) N-face on the bottom in a hexagonal unit cell.

FIG. 1B is a cross-sectional view of a film structure 10 having 2D material interlayer(s) 16 formed by direct growth on the buffer layer(s) 12 of FIG. 1A (e.g., the GaN, AlN, InN, or h-BN templates). FIG. 1C is a cross-sectional view of the film structure 10 of FIG. 1B, but where the 2D material interlayer(s) 16 were formed by a transfer process onto the buffer layer(s) 12 on the substrate 14 (e.g., GaN, AlN, InN, h-BN templates). As shown in FIG. 1B, one or more 2D material interlayers 16 (such as graphene, h-BN, amorphous BN (aBN), polycrystalline BN, cubic boron nitride (c-BN) or other 2D material interlayers) are formed by direct growth (FIG. 1B) or transfer process (FIG. 1C) on the GaN, AlN, InN, or h-BN buffer layer 12 if such optional buffer layer 12 was grown or on the substrate 14 if no buffer layer 12 was grown. The 2D material interlayer 16, such as graphene and h-BN, are grown in the chamber of the MBE or MOCVD tool and preferably has a thickness ranging from 0.1 nm to 10 nm. If the 2D material interface 16 is graphene, the graphene is grown using both gaseous and solid sources for carbon at substrate temperatures which are kept within the range between 600° C. to 1300° C.

FIG. 1D is a cross-sectional view of a film structure 10 having GaN, AlN, InN, or h-BN epilayer(s) 20 (top: metal-face 30 and bottom: N-face 32) grown on the 2D material interlayer(s) 16 of the structure of FIG. 1B or 1C. A GaN, AlN, InN, or h-BN epilayer 20 with a metal-face 30 on top and a N-face 32 on bottom can be grown epitaxially on the formed 2D interlayers 16 on the GaN, AlN, InN, or h-BN templates of FIG. 1B or FIG. 1C. The GaN, AlN, InN, or h-BN epilayer 20 is grown to have a thickness ranging from 0.1 um to 10 um at growth temperatures of 600° C. to 1300° C., similar to those used to form the GaN, AlN, InN, h-BN buffer layer 12, under atmosphere in N₂ RF plasma in a MBE tool. Alternatively, the epilayer(s) 20 can be an x composition incorporating a ternary alloy (for example, $Al_xGa_{1-x}N$, $In_xGa_{1-x}N$, $B_xGa_{1-x}N$, $In_xAl_{1-x}N$, $Ga_xAl_{1-x}N$, $B_xAl_{1-x}N$, $Al_xIn_{1-x}N$, $Ga_xIn_{1-x}N$, $h-Ga_xB_{1-x}N$, and their alloys) of the GaN, AlN, InN, or h-BN where 0<x<1. As yet another alternative, the epilayer(s) 20 can be a x and y composition incorporating a quaternary alloy (for example, $Al_xIn_yGa_{1-x-y}N$, $In_xGa_yAl_{1-x-y}N$, $Al_xGa_yIn_{1-x-y}N$) of the GaN, AlN, or InN epilayer 20 where 0<x<1 and 0<y<1, respectively.

There are several options for creating an N-face III-Nitrides epitaxy layer 20. The first and preferred method is a direct transfer with a flip-over orientation. To do so, a second host substrate 22 is bonded to the metal-face 30 of the III-Nitrides epitaxy layer(s) 20 as shown in FIG. 1E. If desired, substrate 22 can be a heat sink substrate such as poly aluminum nitride, poly silicon carbide, diamond, and other suitable substrates. FIG. 1E is a cross-sectional view of the film structure of FIG. 1D after bonding the metal-face of the GaN, AlN, InN, or h-BN epilayer to a second host substrate.

Then referring to FIG. 1F, the III-Nitrides epitaxy layer(s) 20 and host substrate 22 are exfoliated from, or peeled off, the structure comprising the 2D transfer interlayer 16, optional buffer layer 12, and substrate 14. The III-Nitrides epitaxial layer(s) 20 and substrate 22 can be easily separated from the 2D material interlayer(s) 16 because only a minimal or small mechanical force is required to separate and remove the III-Nitrides epitaxial layer(s) 20 and substrate 22 from the 2D material interlayer(s) 16 because 2D materials have a weak vertical interaction that can be easily overcome. After exfoliating or lifting off the III-Nitrides epitaxial layer(s), the resulting III-Nitride epitaxy layer(s) 20 has a high quality exposed Nitrides-face (N-face) 32. FIG. 1F is a cross-sectional view of the film structure of FIG. 1E after the GaN, AlN, InN, or h-BN epilayer and the second host substrate are lifted off, where the N-face of the epilayer is exposed.

Typical known bonding methods may be used for both (a) the direct transfer method of the III-Nitride epilayer to a substrate without the use of metal stressor layers or a thermal release tape, as shown in, for example, FIGS. 1E and 1F, and (b) the transfer, flip, and reverse transfer method (referred to herein as the "double transfer" method) with the use of optional metal stressor layers and thermal release tape, as shown in, for example, FIGS. 2A-2G. Both methods are described in and covered by this disclosure. For example, bonding methods such as van der Waals bonding, spin-on-glass (SOG) bonding, eutectic bonding, thermal compression bonding, transient liquid phase (TLP) bonding, and other bonding methods may be used. As an example of a spin-on-glass bonding method, a spin coater creates coatings onto the surfaces of the two structures to be bonded, such as the substrate 22 and the metal-face 32 of the III-Nitrides epitaxy layer(s) 20, at a rotation speed of 100 rpm to 5,000 rpm, such as 3000 rpm, for one second to 100 seconds, such as 30 seconds. The two structures are placed on a hot plate so the coatings of the two structures are bonded together. A first baking is performed at a temperature of from 50° C. to 100° C., such as 80° C., for a holding time between 1 minute to 100 minutes, such as 10 minutes. Then a second baking is performed at a temperature of 100° C. to 200° C., such as 150° C., for a holding time of 1 minute to 100 minutes, such as 20 minutes.

An example of eutectic bonding is to coat the surfaces of the two structures to be bonded with a thermal evaporator. The thermal evaporator may deposit aluminum (Al) with a thickness from 0.1 micrometers to 1 micrometer, such as 200 nm, on the first structure, and germanium (Ge) with a thickness from 0.1 micrometers to 1 micrometer, such as 50 nm, on the second structure. The aluminum coating and germanium coating are bonded eutectically by using two steel discs on the top and bottom under nitrogen gas $(N_2)$ atmosphere in a vacuum furnace at a temperature from 100° C. to 1,000° C., such as 450° C. for one to ten hours, such as five hours, at a pressure between one and 100 psi, such as 70 psi.

Figure 2A:
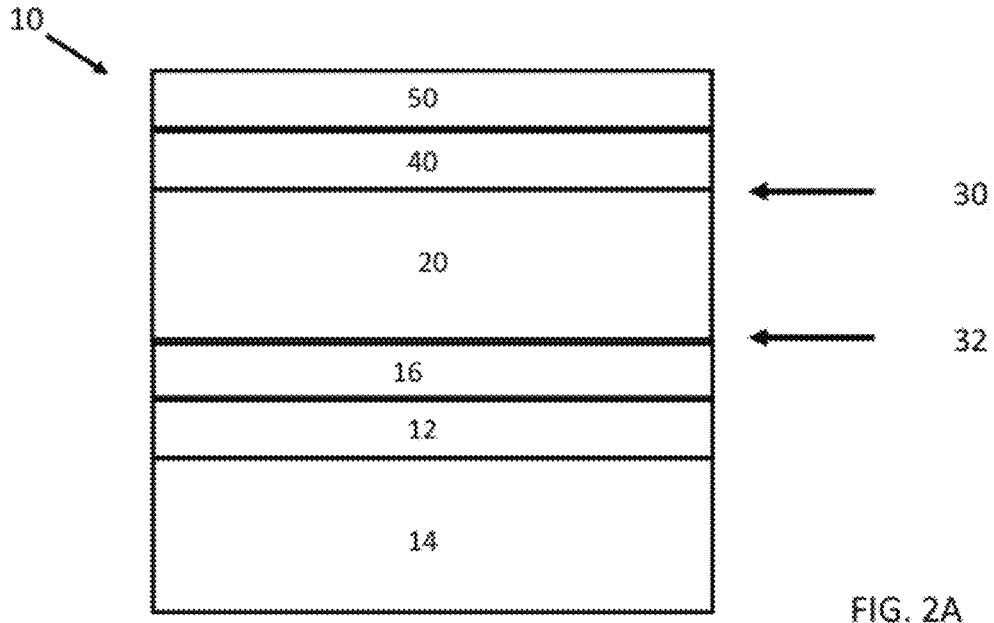
FIG. 2A is a cross-sectional view of a film structure having metal stressor layers with formed on III-Nitrides epilayers (top: metal-face and bottom: N-face) on 2D material interlayers formed by direct growth or a transfer process on a substrate (GaN, AlN, InN, h-BN templates).

The second method to create a III-Nitrides epitaxial layer(s) 20 with a high quality N-face 32 is a double transfer process, as illustrated in FIGS. 2A-2G. The double transfer process is more complex than the direct transfer process and may include the optional, but preferable, use of metal stressor layer(s) and/or thermal release tape. In the double transfer process, before the III-Nitrides epilayers 20 are exfoliated at their interface from the 2D material interlayers 16, metal stressor layers 40, 50 (such as nickel Ni, titanium Ti, chromium Cr, etc.) are preferably and optionally formed on the metal-face 30 of the III-Nitrides epitaxy layer(s) 20, as shown in FIG. 2A. Layer 40 is preferably a metal adhesion layer. For simplicity, a metal adhesion layer throughout this specification will be referred to as a "metal stressor layer," where the engineer may choose to design the structure to use a metal adhesion layer and/or a metal stressor layer, as desired. FIG. 2A is a cross-sectional view of a film structure 10 having metal stressor layers 40, 50 formed on the III-Nitrides epilayer(s) 16 (top: metal-face 30 and bottom: N-face 32) of the structure of FIG. 1D. Note that the buffer layer 12 in FIG. 1D is optional so it can be omitted from FIGS. 2A and 2B. The metal stressor layers 40, 50, if used, serve the purpose of providing rigidity that assists exfoliation of the III-Nitrides epilayer(s) 20. A titanium Ti or chromium Cr metal stressor layer 40 with thickness ranged from 1 nm to 100 nm is grown by electron beam evaporation at room temperature onto the III-Nitrides epilayer(s) 20. A nickel Ni metal stressor layer 50 with thickness ranged from 0.1 um to 1 um is grown by DC magnetron sputtering onto the metal stressor layer 40. Preferably, the metal stressor layers 40, 50 form a double layer of titanium/nickel (Ti/Ni) or chromium/nickel (Cr/Ni), such as a titanium or chromium adhesion layer 40 and a nickel stressor layer 50, on the III-Nitrides epilayer(s) 20. However, a single metal stressor layer or more than two metal stressor layers may also be used.

Figure 2B:
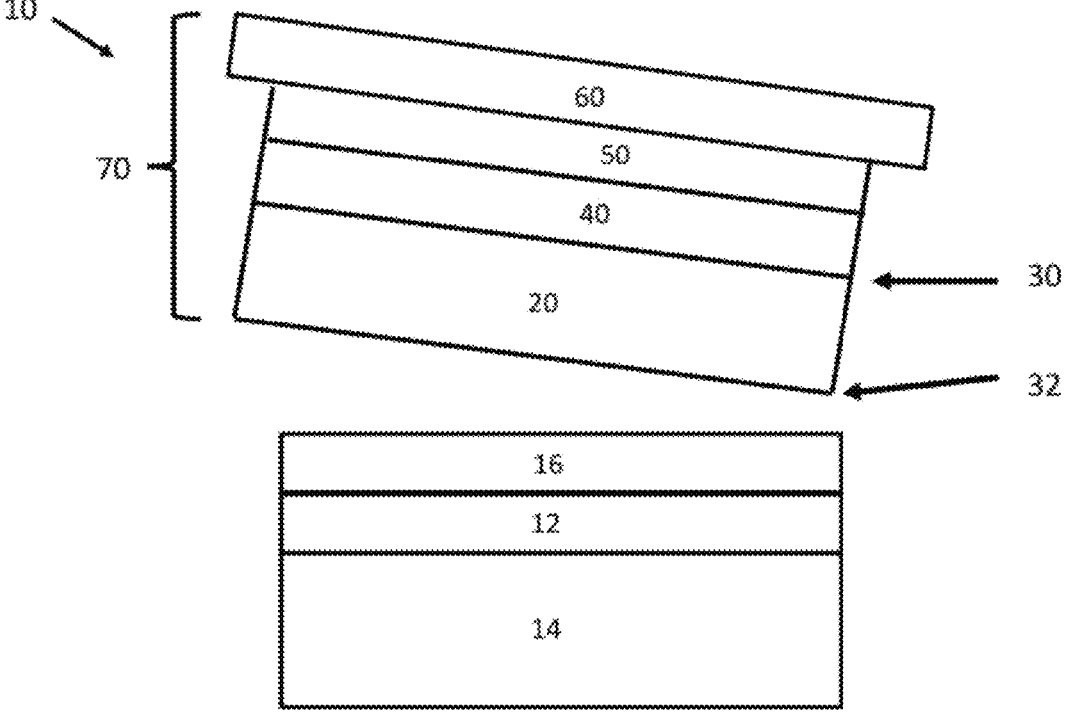
FIG. 2B is a cross-sectional view of the 2D material interlayer(s) of FIG. 2A being lifted off from the substrate by a 2DLT process after a thermal release tape is applied to the film structure of FIG. 2A.

A first thermal release tape 60, such as the Thermal Release Tape for Semiconductor manufactured by Nitto Denko, is applied to the metal stressor layer 50, or if there is no metal stressor layer, to the metal-face 30 of the III-Nitride epitaxy layer(s) 20. The thermal release tape 60 consists of a bottom backing (such as polyester), a thermal release adhesive, and a release liner on top. To apply the thermal release tape 60, one (a) peels off the release liner on the top, (b) tightly and completely adhere the thermal-release adhesive without voids, such as by hand, to the top of the metal stressor layer 50, or the metal-face 30 of the III-Nitride epitaxy layer(s) 20, at room temperature. FIG. 2B is a cross-sectional view of the 2D material interlayer(s) 16 of the structure of FIG. 2A being separated from the sub-strate by a 2DLT process after the first thermal release tape 60 was applied to the film structure of FIG. 2A. As shown in FIG. 2B, the first thermal release tape 60 is applied to the top of the metal stressor layer 50 of the film structure 10 of FIG. 2A. Preferably the first thermal release tape 60 is designed to release at a low temperature. By using the first thermal release tape 60 in a layer transfer (2DLT) process, the III-Nitrides epilayer and metal stressor structure 70 can be easily separated from the 2D material interlayer(s) 16. For example, the III-Nitrides epilayer and metal stressor structure 70 can be lifted off from one side or edge, or equally from all sides. Only a minimal or small mechanical force is required to lift off the structure 70 from the rest of structure 10 because 2D materials have a weak vertical interaction that can be easily overcome.

Figure 2C:
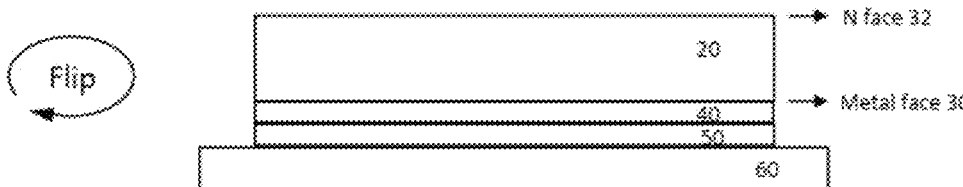
FIG. 2C is a cross-sectional view of film structure having separated III-Nitrides epilayers with a top N-face, bottom metal face, metal stressor layers and a thermal release tape applied after the film structure is flipped over.
Figure 2D:
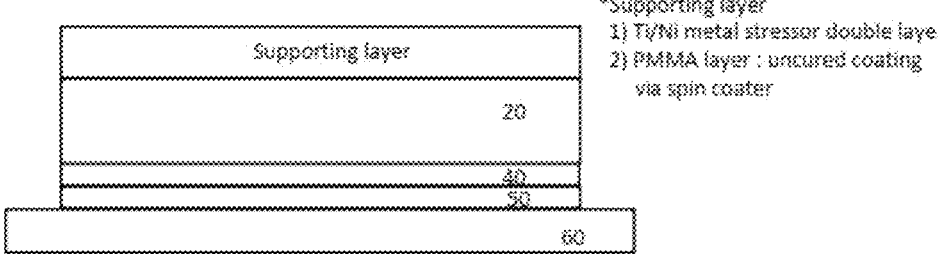
FIG. 2D is a cross-sectional view of the film structure of FIG. 2C after the supporting layer is applied.

FIG. 2C demonstrates the resulting structure of the sepa-rated III-Nitrides epilayer(s) (top: N-face 32 and bottom: metal-face 30) 20, Ti or Cr metal stressor layer 40, Ni metal stressor layer 50, and first thermal release tape 60 after it has been flipped over. As demonstrated in FIG. 2D, as support-ing layers, Ni with thickness ranged from 0.1 um to 1 um is grown by DC magnetron sputtering and Ti and Cr with thickness ranged from 1 nm to 100 nm are grown by electron beam evaporation at room temperature or PMMA layer is coated with spin speeds ranged with 1,000 rpm to 6,000 rpm and spin times ranged with 1 sec. to 180 sec. by spin coater on III-Nitrides epilayers (top: N-face 32 and bottom: metal-face 30) 20. PMMA layer is uncured.

Figure 2E:
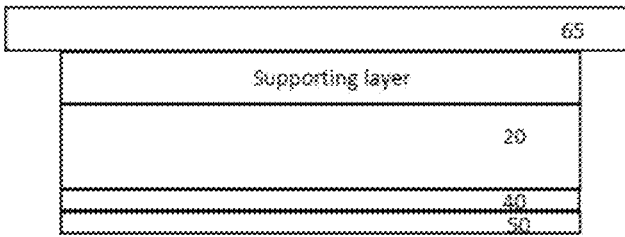
FIG. 2E is a cross-sectional view of the film structure of FIG. 2D after first thermal release tape is removed and then second release tape is applied on supporting layers, subsequently.
Figure 2F:
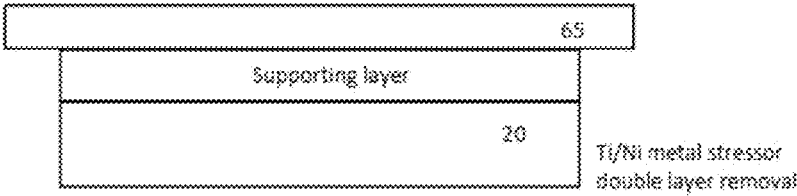
FIG. 2F is a cross-sectional view of the film structure of FIG. 2E after Ti or Cr metal stressor layer and Ni metal stressor layer are removed.
Figure 2G:
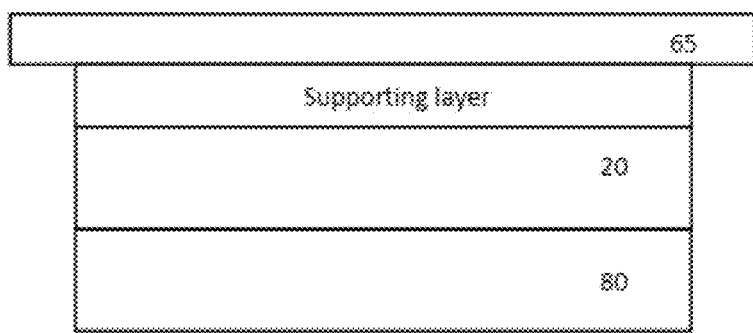
FIG. 2G is a cross-sectional view of the film structure of FIG. 2F after it has been transferred onto host substrate.
Figure 2H:
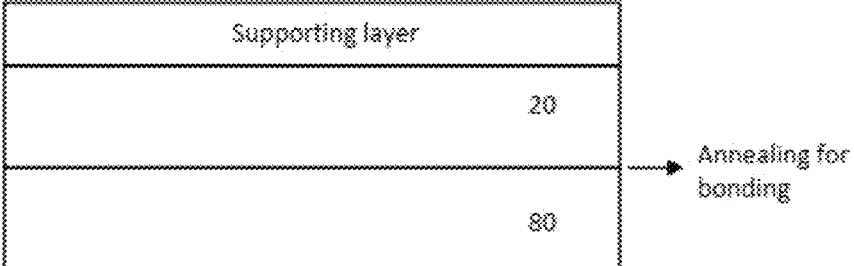
FIG. 2H is a cross-sectional view of the film structure of FIG. 2G after second release tape is removed and then III-Nitrides epilayers and host substrate are directly bonded by annealing.

As demonstrated in FIG. 2E, first thermal release tape 60 is removed through melting adhesive material between Ni stressor layer 50 and release tape at temperatures ranged from 120° C. to 180° C. by hot plate, and then second thermal release tape 65 is applied on supporting layers, subsequently. As demonstrated in FIG. 2F, Ni metal stressor layer 50 is removed by ferric chloride (FeCl3) etchant and Ti or Cr metal stressor layer 40 is removed by buffered oxide etchant (BOE) or chromium etchant, subsequently. And then, III-Nitrides epilayers 20 with supporting layers and second release tape 65 are transferred onto host substrate 80 as demonstrated in FIG. 2G, and then III-Nitrides epilayer(s) 20 and host substrate 80 are directly bonded through anneal-ing at 100° C. to 1,000° C. under nitrogen atmosphere in vacuum furnace after removal of second release tape 65, as demonstrated in FIG. 211.

Figure 2I:
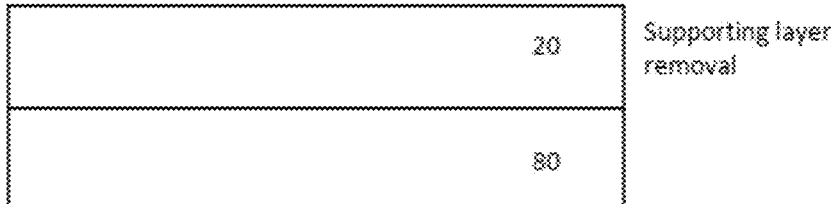
FIG. 2I is a cross-sectional view of the film structure of FIG. 2H after supporting layers are removed.

As demonstrated in FIG. 2I, for removal of supporting layers. Ni metal stressor layer is removed by ferric chloride (FeCl3) etchant and Ti or Cr metal stressor layer is removed by buffered oxide etchant (BOE) or chromium etchant, subsequently or PMMA layer is removed through immers-ing film structures (supporting layers/III-Nitrides epilayers 20/host substrate 80) in acetone solvent. Therefore, we obtain bonded III-Nitrides epilayers (top: N-face 32 and bottom: metal-face 30) 20 and host substrate 80.

Figure 3A:
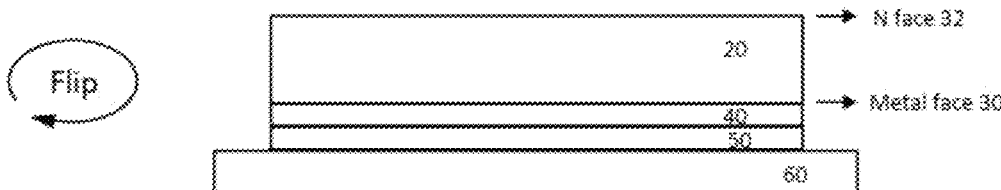
FIG. 3A is a cross-sectional view of the separated III-Nitrides epilayer(s) (top: N-face and bottom: metal-face), Ti or Cr metal stressor layer, Ni metal stressor layer, and first thermal release tape after it has been flipped over.
Figure 3B:
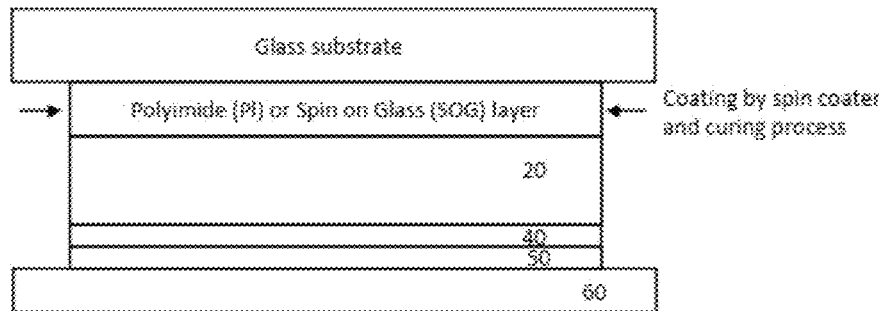
FIG. 3B is a cross-sectional view of the film structure of FIG. 3A after Polyimide (PI) or Spin on Glass (SOG) layer is coated on III-Nitrides epilayers (top: N-face and bottom: metal-face) and then glass substrate is attached.

FIG. 3A demonstrates the resulting structure of the sepa-rated III-Nitrides epilayer(s) (top: N-face 32 and bottom: metal-face 30) 20. Ti or Cr metal stressor layer 40, Ni metal stressor layer 50, and first thermal release tape 60 after it has been flipped over. As demonstrated in FIG. 3I3, Polyimide (PI) or Spin on Glass (SOG) layer is coated with spin speeds ranged with 1,000 rpm to 6,000 rpm and spin times ranged with 1 sec. to 180 sec. on III-Nitrides epilayers (top: N-face 32 and bottom: metal-face 30) 20 by spin coater, and then after attaching glass substrate as handle substance, Polyimide (PI) or Spin on Glass (SOG) layer is cured at the curing temperature ranged from 100° C. to 600° C. and curing time ranged from 1 min. to 180 min. under nitrogen atmosphere in vacuum oven.

Figure 3C:
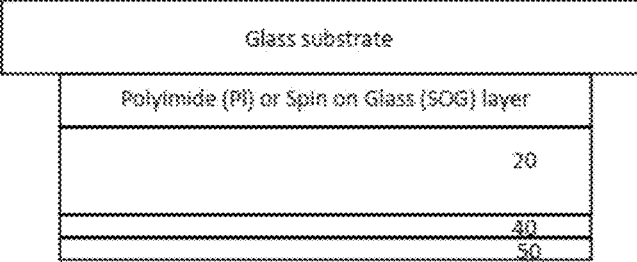
FIG. 3C is a cross-sectional view of the film structure of FIG. 3B after first thermal release tape is removed.
Figure 3D:
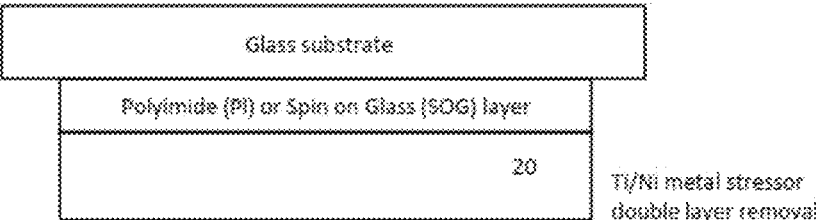
FIG. 3D is a cross-sectional view of the film structure of FIG. 3C after Ti or Cr metal stressor layer and Ni metal stressor layer are removed.

As demonstrated in FIG. 3C, first thermal release tape 60 is removed through melting adhesive material between Ni stressor layer 50 and release tape at temperatures ranged from 120° C. to 180° C. by hot plate. And then, as demonstrated in FIG. 3D, Ni metal stressor layer 50 is removed by ferric chloride (FeCl3) etchant and Ti or Cr metal stressor layer 40 is removed by buffered oxide etchant (BOE) or chromium etchant, subsequently.

As demonstrated in FIG. 3E, III-Nitrides epilayers 20 with Polyimide (PI) or Spin on Glass (SOG) layer and glass substrate are transferred onto host substrate 80, and then II-Nitrides epilayer(s) 20 and host substrate 80 are directly bonded under chamber vacuum of $10^{-3}$ Torr by wafer bonder as demonstrated in FIG. 3F. Bonding temperature is ranged from 100° C. to 500° C., bonding pressure is ranged from 1 MPa to 50 MPa, and bonding time is ranged from 1 min. to 60 min.

As demonstrated in FIG. 3O, Polyimide (PI) or Spin on Glass (SOG) layer is removed via oxygen plasma reactive ion etching (RIE) as dry etching. A power ranged with 10 W to 1,000 W is applied to the RF coil to generate the oxygen plasma. The gas pressure in the chamber is kept at pressure ranged with 10 mTorr to 1,000 mTorr. Total exposure time to oxygen plasma dry etching is optimized in the range of 1 minute to 10 minutes. The oxygen flow rate is optimized in the range of 1 sccm to 100 sccm. Subsequently, the glass substrate is removed by removal of PI layer or SOG layer. Therefore, we obtain bonded III-Nitrides epilayers (top: N-face 32 and bottom: metal-face 30) 20 and host substrate 80.

FIG. 4A demonstrates the film structure of the separated III-Nitrides epilayer(s) (top: metal-face 30 and bottom: N-face 32) 20, Ti or Cr metal stressor layer 40, Ni metal stressor layer 50, and first thermal release tape 60.

As demonstrated in FIG. 4B, Al or Zn metal layer is deposited on Si substrate. Al or Zn metal layer with thickness ranged from 0.01 um to 1 um is grown by DC magnetron sputtering or electron beam evaporation at room temperature. Polyimide (PI) or Spin on Glass (SOG) layer is coated with spin speeds ranged with 1.000 rpm to 6,000 rpm and spin times ranged with 1 sec. to 180 sec. on Al or Zn metal layer, and then III-Nitrides epilayers (top: metal-face 30 and bottom: N-face 32) 20 with Ti or Cr metal stressor layer 40, Ni metal stressor layer 50, and first thermal release tape 60 are attached onto Polyimide (PI) or Spin on Glass (SOG) layer coated Al or Zn metal layer, and then Polyimide (PI) or Spin on Glass (SOG) layer is cured at the curing temperature ranged from 100° C. to 600° C. and curing time ranged from 1 min. to 180 min. under nitrogen atmosphere in vacuum oven.

As demonstrated in FIG. 4C, first thermal release tape 60 is removed through melting adhesive material between Ni stressor layer 50 and release tape at temperatures ranged from 120° C. to 180° C. by hot plate. And then, as demonstrated in FIG. 4D, Ni metal stressor layer 50 is removed by ferric chloride (FeCl3) etchant and Ti or Cr metal stressor layer 40 is removed by buffered oxide etchant (BOE) or chromium etchant, subsequently.

As demonstrated in FIG. 4E, Al or Zn metal layer is removed by Al or Zn etchant (hydrochloric acid (HC) in ethanol), and then Si substrate is removed by removal of Al or Zn metal layer. III-Nitrides epilayers 20 with Polyimide (PI) or Spin on Glass (SOG) layer are flipped over as demonstrated in FIG. 4F, and then III-Nitrides epilayers (top: N-face 32 and bottom: metal-face 30) 20 with Polyimide (PI) or Spin on Glass (SOG) layer flipped over are transferred onto host substrate 80 as demonstrated in FIG. 4G.

Subsequently, III-Nitrides epilayer(s) 20 and host substrate 80 are directly bonded under chamber vacuum of $10^{-3}$ Torr by wafer bonder as demonstrated in FIG. 4I1. Bonding temperature is ranged from 100° C. to 500° C., bonding pressure is ranged from 1 MPa to 50 MPa, and bonding time is ranged from 1 min. to 60 min. As demonstrated in FIG. 4I, Polyimide (PI) or Spin on Glass (SOG) layer is removed via oxygen plasma reactive ion etching (RIE) as dry etching. A power ranged with 10 W to 1.000 W is applied to the RF coil to generate the oxygen plasma. The gas pressure in the chamber is kept at pressure ranged with 10 mTorr to 1,000 mTorr. Total exposure time to oxygen plasma dry etching is optimized in the range of 1 minute to 10 minutes. The oxygen flow rate is optimized in the range of 1 sccm to 100 sccm. Therefore, a bonded III-Nitrides epilayers (top: N-face 32 and bottom: metal-face 30) 20 and host substrate 80 is obtained.

FIG. 5A demonstrates the film structure of the separated III-Nitrides epilayer(s) (top: metal-face 30 and bottom: N-face 32) 20, Ti or Cr metal stressor layer 40, Ni metal stressor layer 50, and first thermal release tape 60.

As demonstrated in FIG. 5B. III-Nitrides epilayers (top: metal-face 30 and bottom: N-face 32) 20 with Ti or Cr metal stressor layer 40, Ni metal stressor layer 50, and first thermal release tape 60 are attached onto Spin on Glass (SOG) layer coated Si substrate, and then Spin on Glass (SOG) layer is cured at the curing temperature ranged from 100° C. to 600° C. and curing time ranged from 1 min. to 180 min. under nitrogen atmosphere in vacuum oven. And then, as demonstrated in FIG. 5C, first thermal release tape 60 is removed through melting adhesive material between Ni stressor layer 50 and release tape at temperatures ranged from 120° C. to 180° C. by hot plate.

As demonstrated in FIG. 5D, Ni metal stressor layer 50 is removed by ferric chloride (FeCl3) etchant and Ti or Cr metal stressor layer 40 is removed by buffered oxide etchant (BOE) or chromium etchant, subsequently. III-Nitrides epilayers 20 with Spin on Glass (SOG) layer and Si substrate are flipped over as demonstrated in FIG. 5E, and then III-Nitrides epilayers (top: N-face 32 and bottom: metal-face 30) 20 with Spin on Glass (SOG) layer and Si substrate flipped over are transferred onto host substrate 80 as demonstrated in FIG. 5F. And then III-Nitrides epilayer(s) 20 and host substrate 80 are directly bonded under chamber vacuum of $10^{-3}$ Torr by wafer bonder as demonstrated in FIG. 5G. Bonding temperature is ranged from 100° C. to 500° C., bonding pressure is ranged from 1 MPa to 50 MPa, and bonding time is ranged from 1 min. to 60 min.

As demonstrated in FIG. 5I1, Spin on Glass (SOG) layer is removed via oxygen plasma reactive ion etching (RIE) as dry etching. A power ranged with 10 W to 1,000 W is applied to the RF coil to generate the oxygen plasma. The gas pressure in the chamber is kept at pressure ranged with 10 mTorr to 1,000 mTorr. Total exposure time to oxygen plasma dry etching is optimized in the range of 1 minute to 10 minutes. The oxygen flow rate is optimized in the range of 1 sccm to 100 sccm. Subsequently, the Si substrate is removed by removal of SOG layer. Therefore, we obtain bonded III-Nitrides epilayers (top: N-face 32 and bottom: metal-face 30) 20 and host substrate 80.

Figure 6:
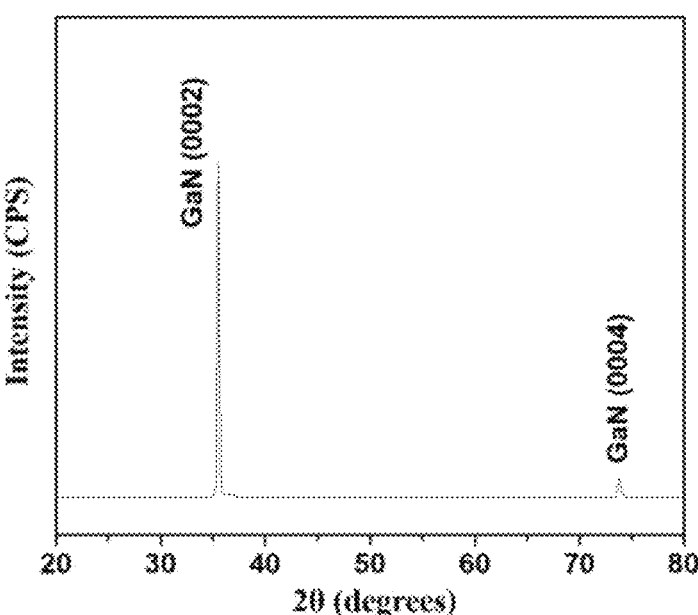
FIG. 6 is a XRD scan graph of the intensity (units in counts-per-second CPS) versus 2θ degrees of a N-face GaN epilayer made in accordance with an embodiment of the novel process.

FIG. 6 is a XRD scan graph of the intensity (CPS unit) versus 20 degrees of a N-face GaN epilayer made in accordance with an embodiment of the novel process. The structural properties of the GaN epilayer 20 are characterized by XRD operated with Cu-Ka radiation (l=1.540 Å). FIG. 6 demonstrates the XRD scan results of intensity (CPS unit) versus 2θ degrees ranging from 20 degrees to 80 degrees. The results, as shown in FIG. 6, establish that the GaN epilayer 20 has been formed on a directly grown 2D material (a-BN) interlayer 16. FIG. 4 clearly establishes that the as-deposited GaN epilayer film 20 shows (0001) oriented Wurtzite GaN characteristic peaks at about 35.7 degrees and 73.6 degrees due to the (0002) and (0004) diffractions of the Wurtzite GaN, respectively. The high order GaN (0002) diffraction peak confirms a good smooth quality of the GaN films grown to epitaxial structure.

Figure 7:
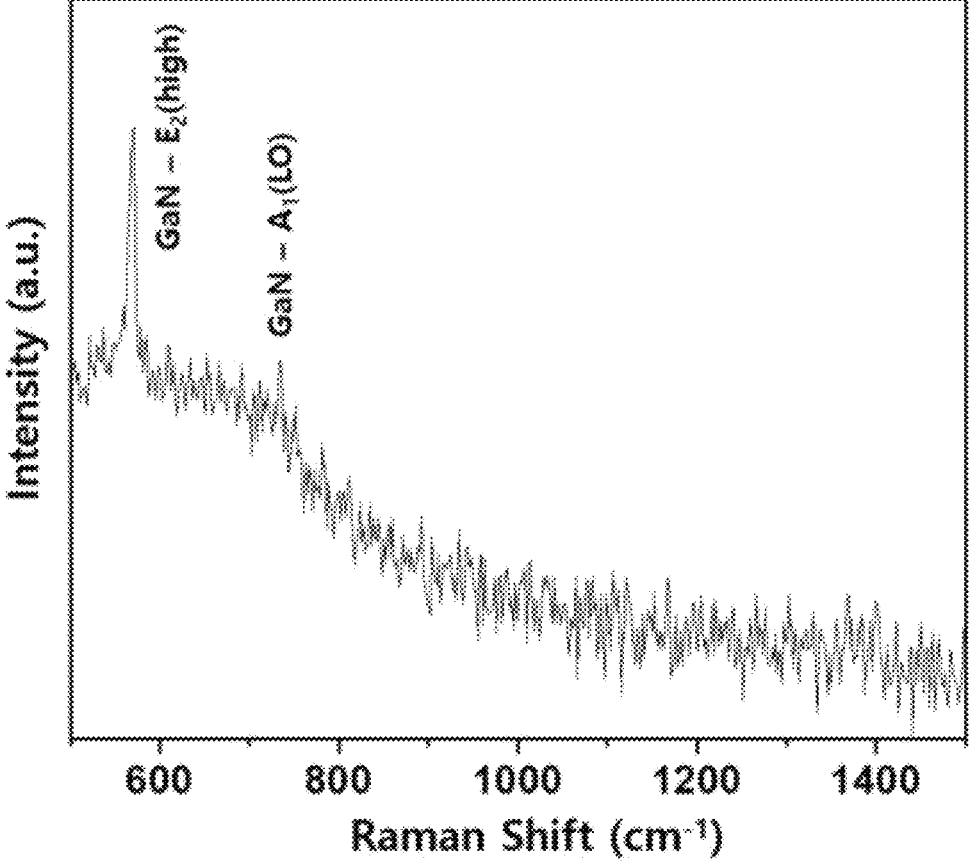
FIG. 7 is a graph showing the Raman spectroscopy of intensity (a.u. unit) versus Raman shift (cm$^{-1}$) of a N-face GaN epilayer made in accordance with an embodiment of the novel method.

FIG. 7 is a graph showing the Raman spectroscopy of intensity (arbitrary count units) versus Raman shift ($cm^{-1}$) of a N-face GaN epilayer 20 made in accordance with an embodiment of the novel method. The $E_2$ (high) peak of the Raman spectrum is used to analyze the residual strain of the GaN epilayer 20. It is well verified that the $E_2$ (high) phonon frequency of a stress-free GaN layer is 569.3 $cm^{-1}$. Additionally, the high height of the $E_2$ (high) peak intensity in Raman spectrum is also evidence of the good crystalline quality of the resulting GaN epilayer 20.

Figure 8:
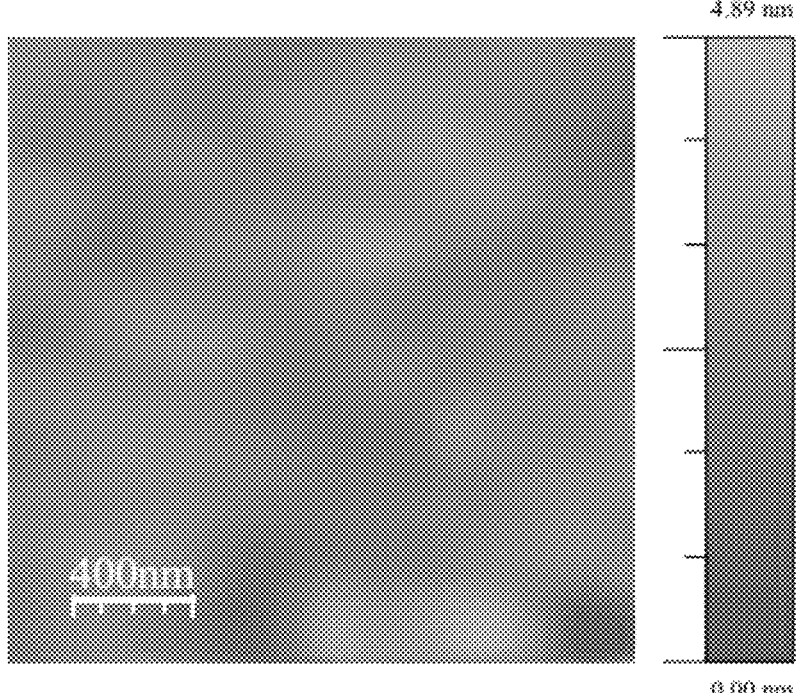
FIG. 8 is an atomic force microscopy (AFM) image of the surface of an N-face GaN epilayer made in accordance with an embodiment of the novel process.

The surface quality of the N-face GaN epilayer 20 that was fabricated in accordance with applicant's novel process was investigated by measuring the root mean square (RMS) roughness through Atomic Force Microscope (AFM). FIG. 8 is an atomic force microscopy (AFM) image of the surface of a N-face GaN epilayer 20 formed on a directly-grown 2D material (a-BN) interlayer 16. The AFM image with 2 um×2 um scan area demonstrates RMS roughness and roughness average (Ra) values of 0.57 nm and 0.42 nm, respectively. The small RMS value of the scan suggests the surface is smooth on an atomic scale.

Therefore, applicant's novel process improves the surface and crystalline quality of N-face ill-Nitrides (including, but not limited to, GaN, AlN, InN, h-BN, $Al_xGa_{1-x}N$, $In_xGa_{1-x}N$, $B_xGa_{1-x}N$, $Al_xIn_yGa_{1-x-y}N$, $In_xAl_{1-x}N$, $Ga_xAl_{1-x}N$, $B_xAl_{1-x}N$, $In_xGa_yAl_{1-x-y}N$, $Al_xIn_{1-x}N$, $Ga_xIn_{1-x}N$, $Al_xGa_yIn_{1-x-y}N$, $h-Ga_xB_{1-x}N$, and their alloys) epilayers.

FIG. 9A is a cross-sectional view of a HEMT film device 900 that uses an embodiment of the novel process. The HEMT device 900 includes HEMTs 910 formed on a substrate 920. Substrate 920 is preferably the resulting structure of FIG. 1F or FIG. 2G, which is preferably an N-face GaN substrate. FIG. 9B is a cross-sectional view of an example of the HEMT film device 900 of FIG. 9A, where the HEMT device is grown on the structure of FIG. 2G and a detailed example of the HEMT 910 is illustrated. In this example, HEMT 910 includes a N-face GaN buffer layer 930 that is an epilayer made in accordance with an embodiment of the novel process, where the metal-face surface 30 faces the substrate 920. A HEMT may be formed on the N-face GaN buffer layer 930. For example, an AlGaN barrier layer 940 is formed on the N-face surface 32 of the GaN epilayer 930. A GaN spacer 950 is formed on the AlGaN barrier layer 940. An AlN barrier layer 960 is formed on the GaN spacer 950. A GaN channel layer 970 is formed on the AlN barrier layer 960. A two-dimensional electron gas (2DEG) 975 exists in the GaN channel layer 970. An AlGaN cap layer 980 is provided on the GaN channel layer 970. The semiconductor processes used to form these layers are either described in this disclosure or are well known in the field.

As a more specific example, N-face GaN buffer layer 930 may have a thickness of about 600 nm but can have a thickness from about 0.1 μm to 1 μm, the AlGaN barrier layer 940 may have a thickness of about 24 nm ($Al_xGa_{1-x}N$; x=0.25) but can have a thickness from about 1 nm to 100 nm ($Al_xGa_{1-x}N$; 0<x<1), the GaN spacer 950 may have a thickness of about 4 nm but can have a thickness from about 1 nm to 10 nm, the AlN barrier layer 960 may have a thickness of about 3 nm but can have a thickness from about 1 nm to 10 nm, the GaN channel layer 970 may have a thickness of about 20 nm but can have a thickness from about 1 nm to 100 nm, and the AlGaN cap layer 980 may have a thickness of about 20 nm ($Al_xGa_{1-x}N$; x=0.1) but can have a thickness from about 1 nm to 100 nm ($Al_xGa_{1-x}N$; 0<x<1).

Figure 10A:
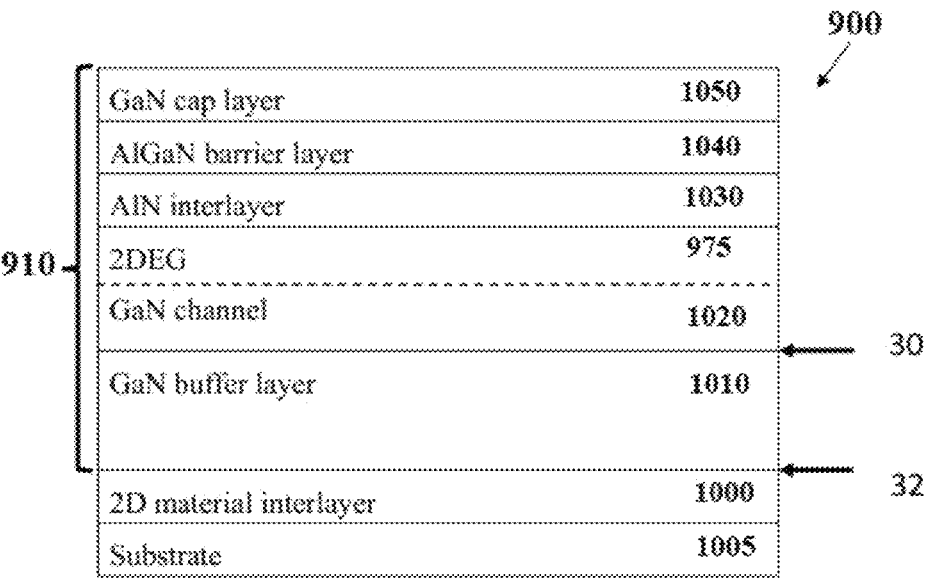
FIG. 10A is a cross-sectional view of a film structure of GaN HEMTs with 2D material interlayers formed by direct growth or a transfer process.

FIGS. 10A to 810G illustrate cross-sectional views of the formation of a HEMT device that uses an embodiment of the novel reverse transfer process that uses optional metal stressor layer(s) and a thermal release tape.

Specifically, FIG. 10A is a cross-sectional view of an example film structure of a HEMT device that is an inverted, or upside down, version of HEMT device 90) and may use an embodiment of the novel reverse transfer method. The HEMT film structure 910 of the HEMT device 900 is grown in an inverted manner, meaning that the film layers are formed in a reverse sequence, so the resulting HEMT device is "upside down." In this example, the HEMT film structure 910 includes a 2D material interlayer 1000 formed by direct growth or by a transfer process on the first host substrate 1005. The 2D material interlayer 1000 may be, for example, graphene or a-BN.

A GaN buffer layer 1010 is formed on the 2D material interlayer 1000 and is an epilayer made in accordance with an embodiment of the novel process, where the N-face surface 32 faces the 2D material interlayer 1000. An GaN channel layer 1020 is formed on the metal-face surface 30 of the GaN buffer epilayer 1010. An AlN interlayer 1030 is formed on the GaN channel layer 1020. A two-dimensional electron gas (2DEG) 1025 exists in the GaN channel layer 1020. A AlGaN barrier layer 1040 is formed on the AlN interlayer 1030. A GaN cap layer 1050 is provided on the AlGaN barrier layer 1040. The semiconductor processes used to form these layers are either described in this disclosure or are well known in the field.

Figure 10B:
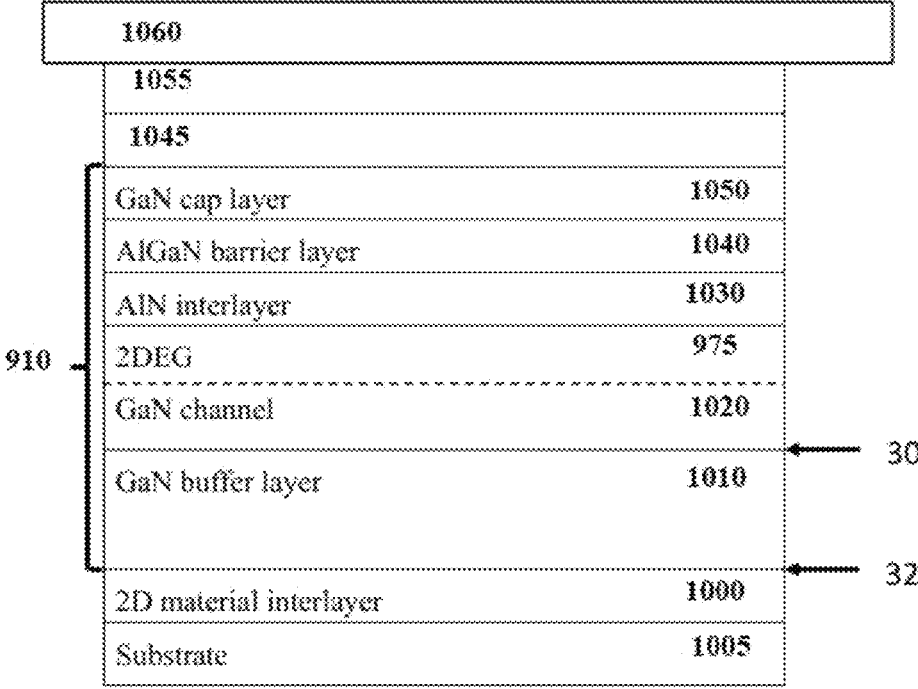
FIG. 10B is a cross-sectional view of the film structure of FIG. 10A after optional metal stressor layers and optional first thermal release tape are applied to the GaN cap layer.

FIG. 10B is a cross-sectional view of the example film structure of the HEMT device 900 of FIG. 10A after metal adhesion and stressor layers 1045, 1055 (such as nickel Ni, titanium Ti, chromium Cr, etc.) are preferably and optionally formed on the GaN cap layer 1050, and a first thermal release tape 1060 is preferably and optionally applied to the metal stressor layer 1055, or if there is no metal stressor layer, to the GaN buffer layer 1050. The metal stressor layers 1045 and 1055, if used, may be the same as or similar to the metal adhesion and stressor layers 40, 50 previously discussed and formed using the same methods as previously described. The metal stressor layer(s) serve the purpose of providing rigidity that assists exfoliation of the film structure residing above the 2D material interlayer 1000. A titanium Ti or chromium Cr metal adhesion layer 1045 with thickness ranged from 1 nm to 100 nm is grown by electron beam evaporation at room temperature onto the GaN buffer layer 1050. A nickel Ni metal stressor layer 1055 with thickness ranged from 0.1 um to 1 um is grown by DC magnetron sputtering onto the metal stressor layer 1045. Preferably, the metal stressor layers 1045, 1055 form a double layer of titanium/nickel (Ti/Ni) or chromium/nickel (Cr/Ni), such as a titanium or chromium stressor layer 1045 and a nickel stressor layer 1055, on the GaN buffer layer 1050. However, a single metal stressor layer or more than two metal stressor layers may also be used. The first thermal release tape 1060 may be, for example, the Thermal Release Tape for Semiconductor manufactured by Nitto Denko, and applied to the metal stressor layer 1055, or if there is no metal stressor layer, to the GaN buffer layer 1050. The thermal release tape 1060 consists of a bottom backing (such as polyester), a thermal release adhesive, and a release liner on top. To apply the thermal release tape 1060, one (a) peels off the release liner on the top. (b) lightly and completely adhere the thermal-release adhesive without voids, such as by hand, to the top of the metal stressor layer 1055, or the GaN buffer layer 1050, at room temperature.

Then, as shown in detail in FIGS. 10C to 10G, a reverse transfer method may be used to exfoliate the HEMT film structure 1010 from the substrate 1005, flip the HEMT film structure 910, and place the flipped HEMT film structure 910 onto another substrate so the HEMT film structure becomes "right side up".

Figure 10C:
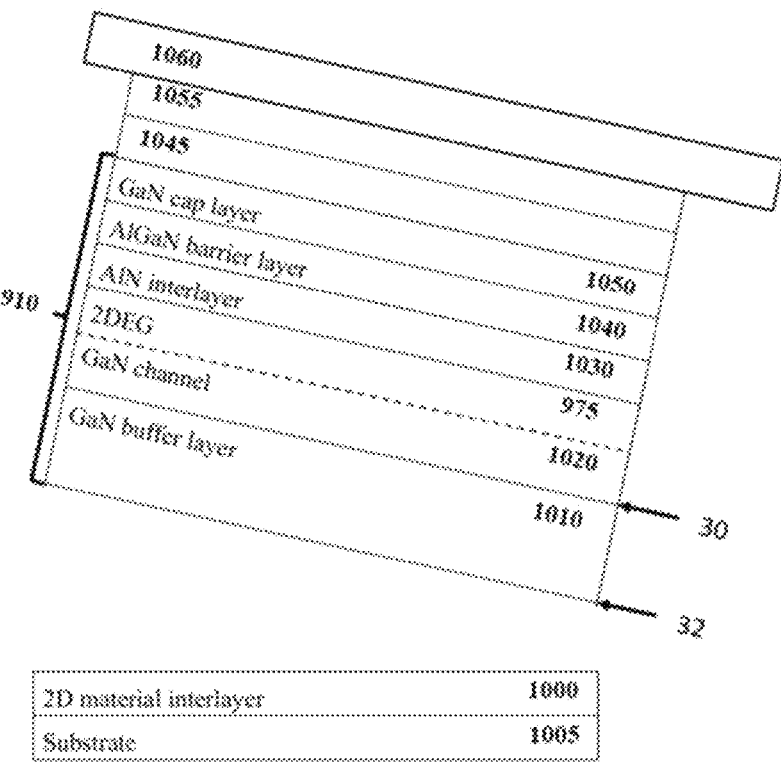
FIG. 10C is a cross-sectional view of a portion of the film structure of the HEMT device of FIG. 10B being lifted off the 2D material interlayer(s) and substrate by a 2DLT process.

FIG. 10C is a cross-sectional view showing the exfoliation of the HEMT film structure 910 of the HEMT device of FIG. 10B by preferably using the first thermal release tape 1060. The first thermal release tape 1060 may be the same as or similar to the thermal release tape 60 discussed earlier and use the same or similar methods for application and removal. By using the thermal release tape 1060 in a layer transfer (2DLT) process, the film structure 910 and metal stressor layers 1045, 1055 can be easily separated from the 2D material interlayer(s) 1000. For example, the film structure 910 and metal stressor layer(s) 1045, 1055 can be lifted off from one side or edge, or equally from all sides. Only a minimal or small mechanical force is required to lift off the film structure 910 from the 2D material interlayer 1000 because 2D materials have a weak vertical interaction that can be easily overcome. Even when no metal stressor layers and no thermal release tape are used, the film structure 910 of the HEMTs can be lifted off and removed from the 2D material interlayer(s) 1000 by using a 2DLT process.

Figure 10D:
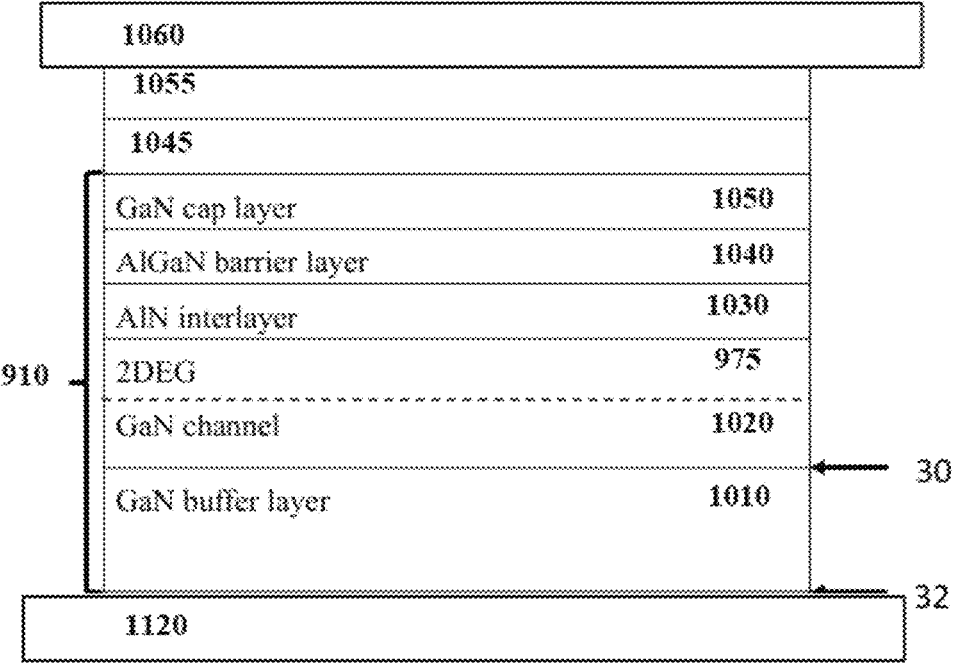
FIG. 10D is a cross-sectional view of the film structure of FIG. 10C after being exfoliated and placed on a second thermal release tape that is applied to the N-face of the GaN buffer layer.

FIG. 10D is a cross-sectional view of the HEMT film structure 910 that was lifted off the substrate 910 of FIG. 10C after it is transferred to a second thermal release tape 1120. The second thermal release tape 1120 is applied to the GaN buffer layer 1010 of the HEMT film structure 910 using the methods for applying thermal release tape described previously. The second thermal release tape 1160 may be the same as or similar to the thermal release tape 60 or 1060 discussed earlier, but has a higher release temperature than the first thermal release tape 1060. As previously explained, when the film structure has two thermal release tapes, the thermal release tape that is to be removed first (e.g., first thermal release tape 1060) should have a release temperature that is lower than the release temperature for the thermal release tape that is to be removed later in time (e.g., second thermal release tape 1120) so the thermal release tapes can be released at different times.

Figures 10E, 10F:
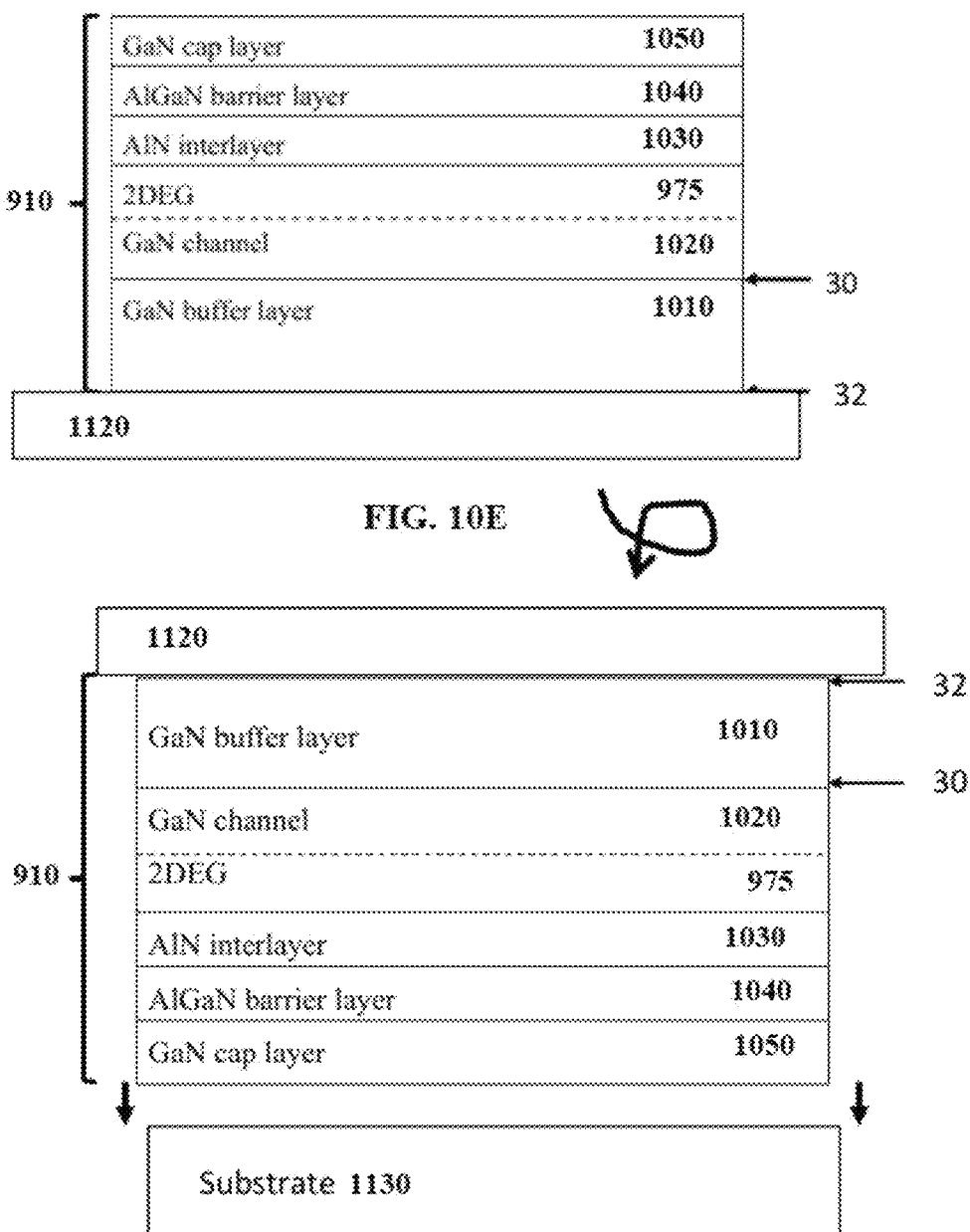
FIG. 10E is a cross-sectional view of the film structure of FIG. 10D after removal of the first thermal release tape and then subsequently the metal stressor layers.
FIG. 10F is a cross-sectional view of the film structure of FIG. 10E after it has been reversely transferred onto another host substrate.

FIG. 10E is a cross-sectional view of the HEMT film structure 910 of FIG. 10D after the metal stressor layer(s) 1045, 1055 and first thermal release tape 1060 are removed. The first thermal release tape 1060 is removed by melting the adhesive material between the metal stressor layer 1055 and the first thermal release tape 106 at a low temperature ranging from 90° C. to 180° C. applied by a hot plate. For example, a Ni metal stressor layer may be removed by ferric chloride (FeCl₃) etchant and the Ti or Cr metal stressor layer may be removed by buffered oxide etchant (BOE) or chromium etchant.

FIG. 10F is a cross-sectional view of the HEMT film structure 910 of FIG. 10E during transfer to a host substrate 1130. The GaN cap layer 1050 of the HEMT film structure 910 is bonded to the substrate 1130, as shown in FIG. 10G.

Figure 10G:
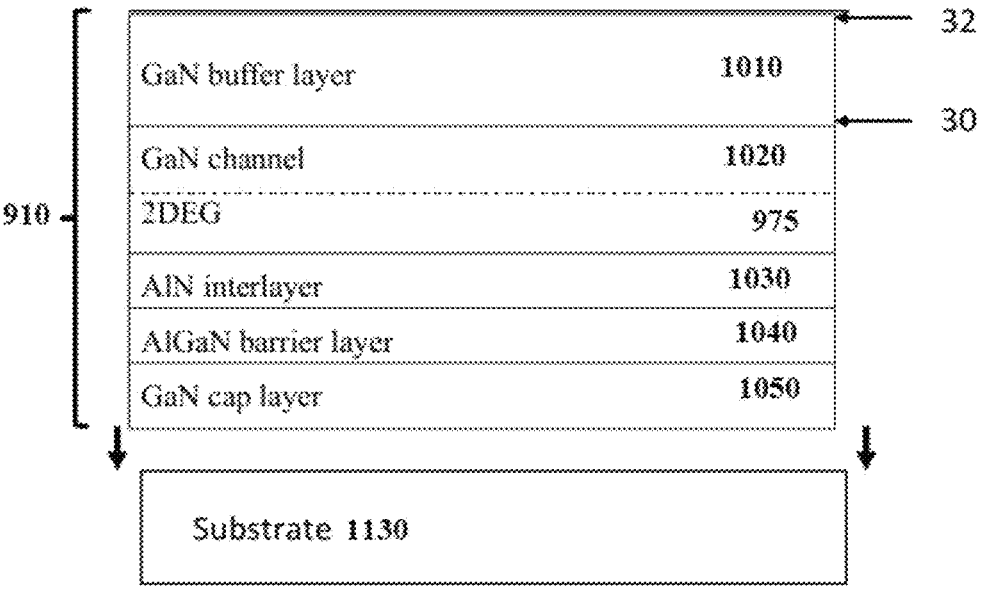
FIG. 10G is a cross-sectional view of the film structure of inverted GaN HEMTs after removal of a second thermal release tape in FIG. 10F.

FIG. 10G is a cross-sectional view of the HEMT film structure 910 after it has been reversely transferred onto a substrate 1130 (top: N-face and bottom: metal-face) and the optional second thermal release tape 1120 is removed. The second thermal release tape 1120 may be removed with the same or similar process for removing other thermal release tapes previously discussed. The substrates 1130, 1005, 920, 80, and 14 may be the same or different than one another. The result is a HEMT device 900 where the N-face 32 of the GaN buffer layer 1010 faces away from the rest of the device 900, while the metal-face 30 of the GaN buffer layer 1010 faces the GaN channel layer 1020.

FIG. 11 is a block flow diagram demonstrating an embodiment of a detailed method for fabricating an N-face surface in a GaN epilayer 20. In step 1202, a common substrate is provided, such as gallium nitride GaN, sapphire, silicon, silicon carbide, and other known substrates. In step 1204, which is an optional step, the substrate is cleaned ex-situ by, for example, boiling in acetone and ethyl alcohol for 5 minutes and dried with flowing nitrogen gas before loaded into a MBE system and then thermally outgassed, for example, in ultrahigh vacuum (UHV) in the chamber of the MBE tool at 900° C. for 1 hour to 2 hours.

In optional step 1206, an optional buffer layer of III-Nitride may be formed on the substrate. Preferably, the buffer layer comprises GaN, AlN, InN, or h-BN. The buffer layer may be formed in a variety of ways, such as by a MBE or MOCVD growth tool. For example, a buffer layer of a thickness ranging from 200 nm to 5 um is grown at substrate temperatures (600° C. to 900° C.) employed for MBE growth of a GaN, AlN, InN, or h-BN layer under nitrogen (N₂) plasma. The metal sources such as gallium (Ga), aluminum (Al), Indium (In), and Boron (B) are provided with ingot type whose purity is preferably at least 99.9999% (6N) to 99.99999% (7N). The nitrogen source is supplied with a radio frequency (RF) nitrogen (N₂) plasma unit through a mass flow controller. The growth temperatures are ranged from 700° C. to 900° C., as measured by a pyrometer. As a result, a GaN, AlN, InN, h-BN template is created, as shown in step 1206.

In step 1208, 2D material interlayer(s) are formed on the GaN, AlN, InN, h-BN templates. For example, a 2D material interlayer of graphene or a-BN may be grown directly onto, or formed and then transferred to, the templates. As a further example, the 2D material interlayer(s) may be grown in the chamber of a MBE tool and preferably has a thickness ranging from 1 nm to 100 nm. If the 2D material interface is graphene, the graphene may be grown using both gaseous and solid sources for carbon at substrate temperatures which are kept within the range between 1000° C. to 1200° C.

In step 1210, an epilayer of III-Nitride is formed onto the 2D material interlayer(s). The epilayer is preferably GaN, AlN. InN, or h-BN having a top metal-face and a bottom N-face and grown by remote epitaxy onto the 2D material interlayer(s). Alternatively, the epilayer can be a ternary or quaternary alloy that incorporates GaN, AlN, InN, and/or h-BN that is grown by remote epitaxy onto the 2D material interlayer(s).

In step 1212, optional metal stressor layer(s) may be formed on the epilayer. Metal stressor layers may be, for example, nickel, titanium, or chromium. Preferably, the metal stressor layers form a double layer of titanium/nickel (Ti/Ni) or chromium/nickel (Cr/Ni), such as a titanium or chromium adhesion layer and a nickel stressor layer, on the III-Nitrides epilayer(s). However, a single metal stressor layer or more than two metal stressor layers may also be used. One may also choose not to use any metal stressor layer.

An optional first thermal release tape is applied to the metal stressor layer, as shown in step 1214, and as previously described with respect to FIG. 2B. For example, the thermal release tape 60 may be the Thermal Release Tape for Semiconductor manufactured by Nitto Denko. It consists of a bottom backing (such as polyester), a thermal release adhesive, and a release liner on top. To apply the thermal release tape, one (a) peels off the release liner on the top, (b) tightly and completely adhere the thermal-release adhesive without voids to the top of the metal stressor layer 50 of the film structure 10 at room temperature. One may also choose not to use any thermal release tape.

In step 1216, the III-Nitrides epilayer-metal stressor layer(s) structure is lifted off and removed from the 2D material interlayer(s) by using a 2DLT process. Even when no metal stressor layers and no thermal release tape are used, the III-Nitrides epilayer can be lifted off and removed from the 2D material interlayer(s) by using a 2DLT process.

In step 1218, the III-Nitrides epilayer(s)-metal stressor layer(s) structure that was lifted off in step 1216 is transferred onto a second thermal release tape. The structure is transferred to the second thermal release tape so that the metal stressor layer(s) can be removed. When no metal stressor layers and no thermal release tape are used, the metal face of the exfoliated III-Nitrides epilayer can be bonded to the final host substrate instead of the second thermal release tape, and then there is no need for an intermediate host substrate.

In step 1220, the first thermal release tape 60 is removed and the metal stressor layer(s) are removed. For example, the first thermal release tape may be removed through melting the adhesive material between the metal stressor layer and the first thermal release tape at a low temperature ranging from 90° C. to 180° C. applied by a hot plate. As a further example, a Ni metal stressor layer may be removed by ferric chloride ($FeCl_3$) etchant and the Ti or Cr metal stressor layer may be removed by buffered oxide etchant (BOE) or chromium etchant, respectively.

In step 1222, the remaining II-Nitrides epilayer(s) are reversely transferred to a final host substrate, where the exposed top surface is the N-face and the bottom is the metal-face contacting the substrate. This results in a III-Nitride epilayer(s) having a high quality N-face surface as shown in step 1222 of FIG. 11 and illustrated in FIG. 2G.

The novel invention may be used in HEMTs, which in turn are used in cell phones, DBS receivers, radar, and voltage converters. Besides HEMTs, the invention may be used in devices, including, but not limited to, Light-Emitting Diodes (LEDs). Photodiodes (PDs), Laser Diodes (LDs), Solar Cells (SCs), and Light-Emitting Solar Cells (LESCs). The internal polarization of N-face GaN material(s) would trigger beneficial impacts on the collection of photogenerated carriers.

Figure 12:
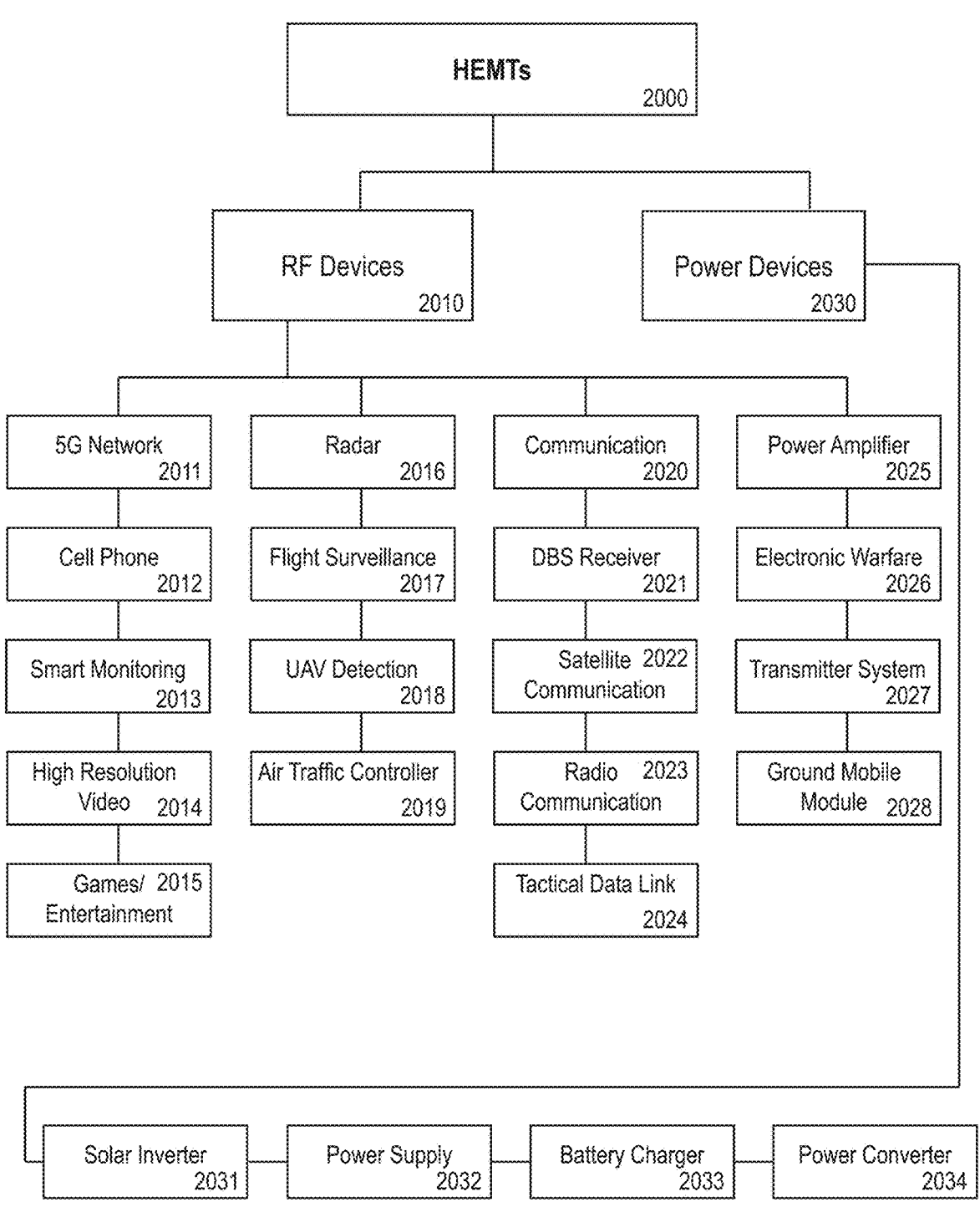
FIG. 12 illustrates examples of system devices that may use the invention.

FIG. 12 illustrates non-exhaustive examples of system devices that may use the invention. Such devices include, but are not limited to, HEMTs 2000 that are either made by (a) the direct transfer method of a III-Nitride epilayer to a substrate without the use of metal stressor layers or a thermal release tape or (b) the transfer, flip, and reverse transfer method with the potential use of optional metal stressor layers and optional thermal release tape, both of which methods are described in this disclosure. HEMTs 2000 are either RF devices 2010 or power devices 2030. RF devices 2010 include, but are not limited to, semiconductor devices for 5G networks 2011, cell or mobile phones 2012, smart monitors 2013, high resolution video devices 2014, game and entertainment systems 2015, radar 2016, flight surveillance systems 2017, UAV detectors 2018, air traffic controllers 2019, communication devices 2020, DBS receivers 2021, satellite communication devices 2022, radios 2023, tactical data link devices 2024, power amplifiers 2025, electronic warfare devices 2026, transmitters 2027, and ground mobile modules 2028. Power devices 2030 include, but are not limited to, solar inverters 2031, power supplies 2032, battery chargers 2033, and power converters 2034. These devices may include input terminals, output terminals, integrated circuits that include at least one HEMT made by the novel process described herein, a battery or power supply for supplying power to the HEMT, and other well known components such as antennas, transmitters, receivers, displays, memories and processors.

While various embodiments of the present invention have been described above, it should be understood that they have been presented by way of example only and not by limitation. Further, although several embodiments of the present invention have been discussed, numerous additions, deletions, substitutions, and/or alterations to the invention may be readily suggested to one of skill in the art without departing from the scope of the appended claims. It is intended therefore that the appended claims encompass such additions, deletions, substitutions, and/or alterations. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents. Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which per forms the specified function of the described component (i.e., that is functionally equivalent), even though not structurally equivalent to the disclosed structure which performs the function in the herein illustrated exemplary implementations of the invention. In addition, while a particular feature, structure, or step of the invention may have been disclosed with respect to only one of several implementations (e.g., thermal release tapes, metal stressor layers, substrates, direct transfer method, reverse transfer method, exfoliation, film thicknesses, semiconductor processes, MBE, MOCVD, etc), such feature, structure, or step may be mixed and matched from one embodiment to another embodiment, or combined with one or more other features of the other implementations as may be desired and advantageous for any given or particular application. Specifically, applicant envisions that the disclosed thermal release tapes, metal stressor layers, substrates, direct transfer method, reverse transfer method, exfoliation, film thicknesses, and various semiconductor processes can be applied to any of the embodiments, devices, and systems. Furthermore, to the extent that the terms "includes", "having", "has", "with", or variants thereof are used in either the detailed description or the claims, such terms are intended to be inclusive in a manner similar to the term "comprising."

I claim:

1. A method of fabricating a III-Nitride epilayer having an exposed Nitride-face, the method comprising the steps of:
   providing a first substrate;
   optionally forming a buffer layer on the first substrate if the buffer layer is desired;
   forming a 2D material interlayer on the buffer layer if the buffer layer is present, or on the first substrate if the buffer layer is not present on the first substrate;
   using remote epitaxy to grow a III-Nitride epilayer on the 2D material interlayer, the epilayer having a Nitride-face facing the 2D material interlayer and having a metal-face;
   separating and removing the epilayer from the 2D material interlayer;
   applying a first thermal release film to the Nitride-face of the epilayer;
   bonding the metal-face of the epilayer to a second substrate;
   removing the first thermal release film;
   applying a second thermal release film on the metal-face of the epilayer;
   exerting force on the second thermal release film to separate the epilayer from the 2D material interlayer, wherein the step of separating and removing the epilayer from the 2D material interlayer includes the step of exerting force; and
   removing the second thermal release film after the step of separating and removing the epilayer from the 2D material interlayer.

2. A method of fabricating a III-Nitride epilayer having an exposed Nitride-face, the method comprising the steps of:
   providing a first substrate;
   optionally forming a buffer layer on the first substrate if the buffer layer is desired;
   forming a 2D material interlayer on the buffer layer if the buffer layer is present, or on the first substrate if the buffer layer is not present on the first substrate;
   using remote epitaxy to grow a III-Nitride epilayer on the 2D material interlayer, the epilayer having a Nitride-face facing the 2D material interlayer and having a metal-face;
   separating and removing the epilayer from the 2D material interlayer;
   applying a first thermal release film to the Nitride-face of the epilayer;
   bonding the metal-face of the epilayer to a second substrate;
   removing the first thermal release film;
   forming a first stressor layer on the metal face of the epilayer before the step of separating and removing the epilayer from the 2D material interlayer;
   applying a second thermal release film on the first stressor layer;
   exerting force on the second thermal release film to separate the epilayer from the 2D material interlayer, wherein the step of separating and removing the epilayer from the 2D material interlayer includes the step of exerting force;
   removing the second thermal release film after the step of separating and removing the epilayer from the 2D material interlayer; and
   removing the first stressor layer.

3. A method of fabricating a III-Nitride epilayer having an exposed Nitride-face, the method comprising the steps of:
   providing a first substrate;
   optionally forming a buffer layer on the first substrate if the buffer layer is desired;
   forming a 2D material interlayer on the buffer layer if the buffer layer is present, or on the first substrate if the buffer layer is not present on the first substrate;
   using remote epitaxy to grow a III-Nitride epilayer on the 2D material interlayer, the epilayer having a Nitride-face facing the 2D material interlayer and having a metal-face;
   separating and removing the epilayer from the 2D material interlayer;
   applying a first thermal release film to the Nitride-face of the epilayer;
   bonding the metal-face of the epilayer to a second substrate;
   removing the first thermal release film;
   forming an adhesion layer on the metal face of the epilayer before the step of separating and removing the epilayer from the 2D material interlayer;
   forming at least one second stressor layer on the adhesion layer;
   applying a second thermal release film on the at least one second stressor layer;
   exerting force on the second thermal release film to separate the epilayer from the 2D material interlayer, wherein the step of separating and removing the epilayer from the 2D material interlayer includes the step of exerting force;
   removing the second thermal release film after the step of separating and removing the epilayer from the 2D material interlayer;
   removing the at least one second stressor layer; and
   removing the adhesion layer.

4. A method of fabricating a high electron mobility transistor device comprising the steps of:
   forming a 2D material interlayer on a substrate;
   forming a high electron mobility transistor device on the 2D material interface, wherein the high electron mobility transistor device comprises a gallium nitride cap layer and a gallium nitride buffer layer having a metal face facing away from the 2D material interlayer and facing the gallium cap layer and a III-Nitride face facing the 2D material interlayer;
   forming an optional stressor layer on the gallium cap layer;
   applying a first thermal release film on the optional stressor layer, or on the gallium cap layer in the absence of the optional stressor layer;
   applying force to the first thermal release film to separate the high electron mobility transistor device from the 2D material interlayer;
   placing the high electron mobility transistor device on a second thermal release film;
   removing the first thermal release film;
   removing the optional stressor layer if it exists;

placing the high electron mobility transistor device on a second substrate, wherein the gallium cap layer of the high electron mobility transistor device is adjacent to the second substrate; and removing the second thermal release film.

5. The method of claim 4 wherein the high electron mobility transistor device comprises:

a gallium nitride channel layer on the gallium nitride buffer layer;

an aluminum nitride layer on the gallium nitride channel layer; and an aluminum gallium nitride barrier layer between the aluminum nitride layer and the gallium nitride cap layer.

\* \* \* \* \*